(12) United States Patent
Bae et al.

(10) Patent No.: US 11,908,987 B2
(45) Date of Patent: Feb. 20, 2024

(54) DISPLAY DEVICE AND METHOD OF MANUFACTURING THE SAME

(71) Applicant: Samsung Display Co., LTD., Yongin-si (KR)

(72) Inventors: Kwang Soo Bae, Yongin-si (KR); Dong Uk Kim, Yongin-si (KR); Beom Soo Park, Yongin-si (KR); Min Jeong Oh, Yongin-si (KR); Young Je Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/988,921

(22) Filed: Nov. 17, 2022

(65) Prior Publication Data
US 2023/0108979 A1   Apr. 6, 2023

Related U.S. Application Data

(62) Division of application No. 16/993,948, filed on Aug. 14, 2020, now Pat. No. 11,522,113.

(30) Foreign Application Priority Data

Oct. 2, 2019   (KR) .......................... 10-2019-0122256

(51) Int. Cl.
*H01L 33/62* (2010.01)
*H01L 33/60* (2010.01)
(Continued)

(52) U.S. Cl.
CPC ............ *H01L 33/62* (2013.01); *H01L 27/156* (2013.01); *H01L 33/005* (2013.01); *H01L 33/50* (2013.01);
(Continued)

(58) Field of Classification Search
CPC ..... H01L 33/62; H01L 27/156; H01L 33/005; H01L 33/50; H01L 33/60; H01L 2933/0058; H01L 2933/0066; H01L 25/0753; H01L 33/0095; H01L 33/44; H01L 33/20; H01L 21/76834; H01L 21/76838; H01L 33/0045
See application file for complete search history.

(56) References Cited

U.S. PATENT DOCUMENTS

2002/0113244 A1 * 8/2002 Barnett ................... F21V 29/74
                                                          257/E33.059
2004/0190304 A1 * 9/2004 Sugimoto ............... F21V 29/83
                                                          257/E33.059

(Continued)

*Primary Examiner* — Victor A Mandala
(74) *Attorney, Agent, or Firm* — KILE PARK REED & HOUTTEMAN PLLC

(57) ABSTRACT

A display device includes a substrate and a display element layer disposed on the substrate and emitting light. The display element layer includes a first electrode electrically connected to a portion of a first light emitting element, a second electrode electrically connected to another portion of the first light emitting element, and at least one insulating structure disposed on the substrate and having a convex shape protruding from the substrate. The first light emitting element is disposed in a space of the at least one insulating structure. A method of manufacturing the display device is also disclosed.

10 Claims, 17 Drawing Sheets

(51) Int. Cl.
*H01L 33/00* (2010.01)
*H01L 33/50* (2010.01)
*H01L 27/15* (2006.01)

(52) U.S. Cl.
CPC ...... *H01L 33/60* (2013.01); *H01L 2933/0058* (2013.01); *H01L 2933/0066* (2013.01)

(56) References Cited

U.S. PATENT DOCUMENTS

| | | | | |
|---|---|---|---|---|
| 2006/0226758 | A1* | 10/2006 | Sofue | C09D 183/04 |
| | | | | 257/E33.059 |
| 2007/0085105 | A1* | 4/2007 | Beeson | G02B 19/0071 |
| | | | | 257/E33.072 |
| 2007/0086211 | A1* | 4/2007 | Beeson | H01L 33/60 |
| | | | | 362/616 |
| 2009/0021157 | A1* | 1/2009 | Kim | H10K 50/865 |
| | | | | 445/24 |
| 2012/0248469 | A1* | 10/2012 | Choi | H01L 33/54 |
| | | | | 257/E33.072 |
| 2014/0306261 | A1* | 10/2014 | Im | H01L 33/62 |
| | | | | 257/99 |
| 2014/0376219 | A1* | 12/2014 | Ono | G02F 1/133606 |
| | | | | 362/235 |
| 2015/0349219 | A1* | 12/2015 | Lee | H01L 33/486 |
| | | | | 257/98 |
| 2016/0365486 | A1* | 12/2016 | Kim | H01L 33/24 |
| 2018/0108710 | A1* | 4/2018 | Lin | G06F 3/0448 |
| 2018/0315908 | A1* | 11/2018 | Lee | H01L 33/56 |
| 2018/0338379 | A1 | 11/2018 | Bemmerl et al. | |
| 2021/0226106 | A1* | 7/2021 | Yun | H01L 33/54 |

\* cited by examiner

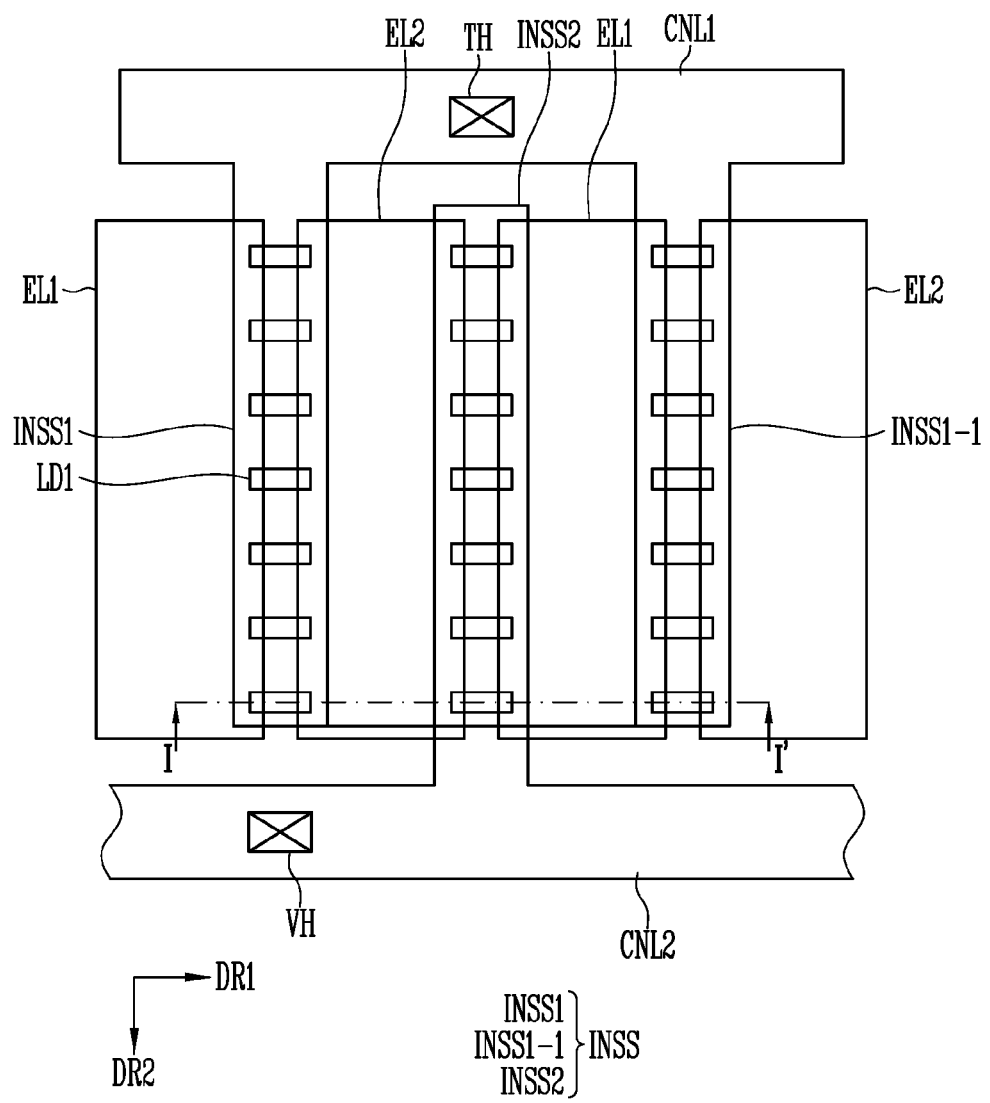

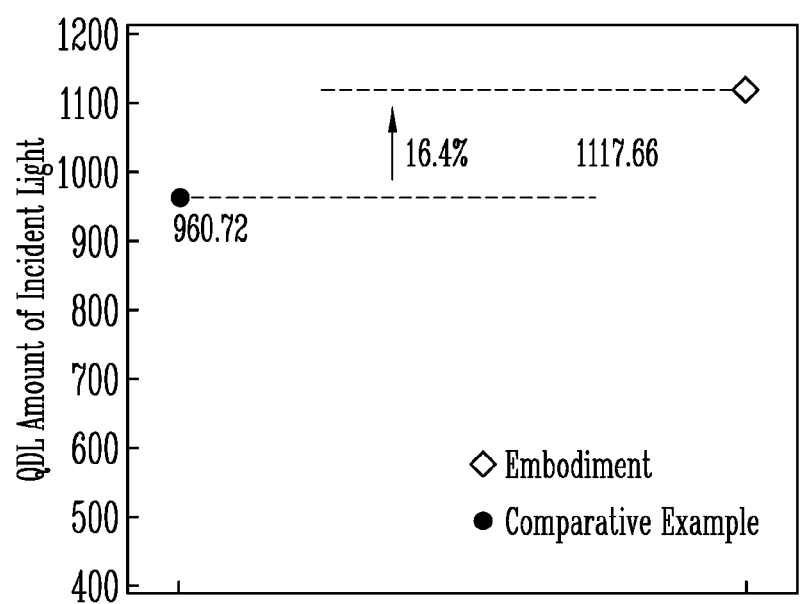

DISPLAY DEVICE AND METHOD OF MANUFACTURING THE SAME

CROSS-REFERENCE TO RELATED APPLICATION

This is a divisional application of U.S. patent application Ser. No. 16/993,948, filed Aug. 14, 2020, the disclosure of which is incorporated herein by reference in its entirety. U.S. patent application Ser. No. 16/993,948 claims priority to and the benefit of Korean Patent Application No. 10-2019-0122256 under 35 U.S.C. § 119, filed in the Korean Intellectual Property Office on Oct. 2, 2019, the entire contents of which are incorporated herein by reference.

BACKGROUND

1. Technical Field

Embodiments of the invention relate to a display device and a method of manufacturing the same.

2. Description of the Related Art

The importance of display devices as communication media, has been emphasized because of the increasing developments of information technology. Light emitting diodes (hereinafter referred to as LEDs) in general exhibit relatively desirable durability even under adverse environments and have excellent characteristics in terms of lifetime and luminance. In recent years, researches and developments for applying such LEDs to various types of display devices have been actively conducted.

As a part of these researches, a technique for manufacturing microscale or a nanoscale LEDs, using inorganic structure material, has been under development. For example, a technique of growing nitride-based semiconductor is used in manufacturing of the micro or nanoscale LEDs. Rod-shaped LEDs may be manufactured as small as to be able to constitute a pixel or the like of a display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are provided for a display device having excellent alignment degree of light emitting elements and a method of manufacturing the same.

A display device according to an embodiment may include a substrate, and a display element layer disposed on the substrate and emitting light. The display element layer may include a first electrode electrically connected to a portion of the first light emitting element, a second electrode electrically connected to another portion of the first light emitting element and at least one insulating structure disposed on the substrate and having a convex shape protruding from the substrate. The first light emitting element may be disposed in the a space of the at least one insulating structure.

In an embodiment of the invention, the space of the at least one insulating structure may be an empty space.

In an embodiment of the invention, the space of the at least one insulating structure may be separated from outside of the at least one insulating structure.

In an embodiment of the invention, the at least one insulating structure may include a hole through which the space is exposed to the outside of the at least one insulating structure.

In an embodiment, the at least one insulating structure may include a first insulating structure and a second insulating structure adjacent to each other, and the first light emitting element may be disposed in the space of each of the first insulating structure and the second insulating structure.

In an embodiment, the first electrode or the second electrode may be disposed between the first insulating structure and the second insulating structure. A first portion of the first electrode or the second electrode may be electrically connected to the first light emitting element in the space of the first insulating structure, and a second portion of the first electrode or the second electrode may be electrically connected to the first light emitting element in the space of the second insulating structure.

In an embodiment, the first electrode and the second electrode each may include a portion exposed to outside of the first insulating structure and the second insulating structure, and the display element layer may further include a second light emitting element disposed between the first insulating structure and the second insulating structure and electrically connected to the portion of the first electrode and the portion of the second electrode that are adjacent to each other.

In an embodiment, the display element layer may further include a reflective layer disposed on a surface of the at least one insulating structure and reflecting the light emitted from the first light emitting element.

In an embodiment, the reflective layer may include a first reflective layer overlapping the first electrode and a second reflective layer overlapping the second electrode. The first reflective layer may be electrically connected to the first electrode and the second reflective layer may be electrically connected to the second electrode.

In an embodiment, the display device may further include a light conversion layer disposed on the display element layer and converting the light emitted from the first light emitting element.

A method of manufacturing a display device may include forming a first electrode and a second electrode on a substrate, forming at least one pattern on the substrate to have a convex shape with respect to the substrate and to expose a portion of the first electrode and a portion of the second electrode, sequentially forming an insulating layer and a conductive material layer on the substrate, patterning the conductive material layer to form a third electrode exposing a portion of the insulating layer, patterning the insulating layer to form a hole exposing the at least one pattern, removing the at least one pattern from the substrate to form at least one insulating structure having the convex shape with respect to the substrate, providing a first light emitting element for emitting light in the at least one insulating structure, and aligning the first light emitting element between the first electrode and the second electrode.

In an embodiment, the removing of the at least one pattern may include removing the at least one pattern through the hole to form a space in the at least one insulating structure.

In an embodiment, the providing of the first light emitting element may include disposing the first light emitting element in the space of the at least one insulating structure through the hole.

In an embodiment, the aligning of the first light emitting element may include applying a voltage to the first electrode, the second electrode, and the third electrode.

In an embodiment, the sequentially forming of the conductive material layer may include electrical connecting the conductive material layer to the first electrode and the second electrode.

In an embodiment, the aligning of the first light emitting element may include applying a voltage to the first electrode and the second electrode.

In an embodiment, the at least one pattern may include a first pattern and a second pattern adjacent to each other. The removing of the at least one pattern may include exposing the portion of the first electrode and the portion of the second electrode disposed between the first pattern and the second pattern.

In an embodiment, the at least one insulating structure may include a first insulating structure and a second insulating structure adjacent to each other, and the method may further include providing a second light emitting element between the first insulating structure and the second insulating structure.

In an embodiment, the method may further include aligning the second light emitting element between the first insulating structure and the second insulating structure. The aligning of the second light emitting element and the aligning of the first light emitting element may be simultaneously performed.

In an embodiment, the method may further include providing a light conversion layer on the at least one insulating structure for converting the light emitted from the first light emitting element.

BRIEF DESCRIPTION OF THE DRAWINGS

Embodiments of the disclosure, which are included to provide a further understanding of the inventive concepts, and are incorporated in and constitute a part of this specification, illustrate embodiments of the inventive concepts, and, together with the description, serve to explain principles of the inventive concepts.

FIG. 4 is a schematic plan view illustrating a light emitting region of a display element layer according to an embodiment including the light emitting element of FIG. 1A or 1B.

FIG. 15 is a graph showing the amount of light when light emitted from light emitting elements of the display element layer of FIGS. 14A and 14B is incident on a quantum dot layer.

DETAILED DESCRIPTION OF THE ILLUSTRATED EMBODIMENTS

Figure 1A:
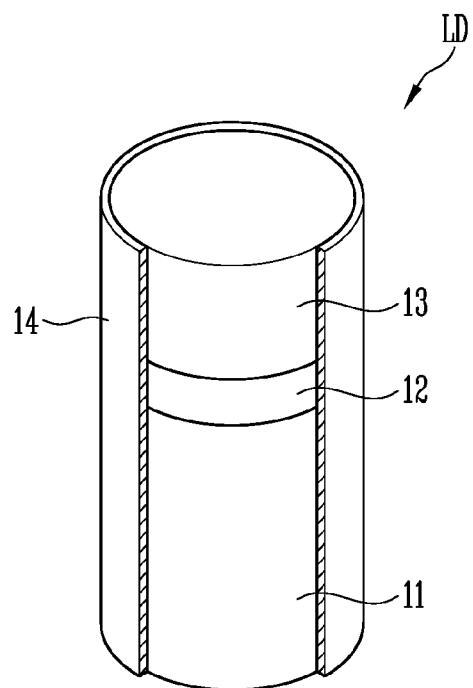
FIGS. 1A and 1B are schematic perspective views illustrating a light emitting element according to an embodiment.

Reference will now be made in detail to various embodiments of the disclosure, specific examples of which are illustrated in the accompanying drawings and described below, since the embodiments of the disclosure may be variously modified in many different forms. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. The singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Hereinafter, embodiments will be described in detail with reference to the accompanying drawings.

A display device according to an embodiment may include a substrate SUB, a pixel circuit layer PCL including transistors, and a display element layer DPL including light emitting elements LD.

Figure 1B:
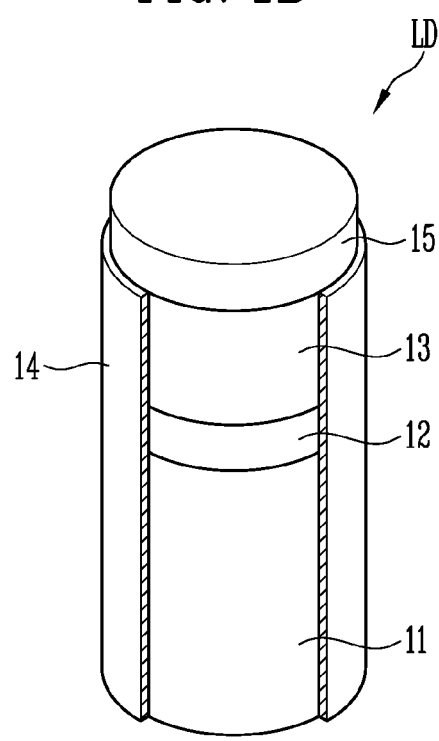

FIGS. 1A and 1B are schematic perspective views illustrating a light emitting element according to an embodiment. In FIGS. 1A and 1B, although a light emitting element LD having circular columnar shape is illustrated, the shape of the light emitting element LD is not limited thereto.

Referring to FIGS. 1A and 1B, the light emitting element LD may include a first semiconductor layer 11, a second semiconductor layer 13, and an active layer 12 disposed between the first semiconductor layer 11 and the second semiconductor layer 13.

For example, the light emitting element LD may be implemented as a laminate structure in which the first semiconductor layer 11, the active layer 12, and the second semiconductor layer 13 are sequentially stacked.

According to an embodiment, the light emitting element LD may have a rod shape extending in one direction. When the extending direction of the light emitting element LD may be called a longitudinal direction, the light emitting element LD may have one end and the other end along the longitudinal direction.

In an embodiment, one of the first semiconductor layer 11 and the second semiconductor layer 13 may be disposed at the one end (for example, a first portion), and the other of the first semiconductor layer 11 and the second semiconductor layer 13 may be disposed at the other end (for example, a second portion).

As mentioned above, the light emitting element LD may have the rod shape. Here, the term "rod shape" may mean a rod-like shape or a bar-like shape that has a length in the longitudinal direction (that is, having an aspect ratio greater than 1), such as a cylinder, a polygonal column, or the like. For example, a length of the light emitting element LD may be larger than a diameter thereof.

For example, the light emitting element LD may be manufactured to have a small size such that its diameter and/or length is about micro scale or nano scale.

However, the size of the light emitting element LD is not limited thereto. The size of the light emitting element LD may vary depending on and satisfying requirements of a display device to which the light emitting element LD is applied.

The first semiconductor layer 11 may include at least one n-type semiconductor layer. For example, the first semiconductor layer 11 may include any one of semiconductor materials such as InAlGaN, GaN, AlGaN, InGaN, AlN, and InN, and may be doped with a first conductive dopant such as Si, Ge, Sn, or the like.

However, the material constituting the first semiconductor layer 11 is not limited thereto. The first semiconductor layer 11 may be formed of various materials.

The active layer 12 may be formed on the first semiconductor layer 11 and may have a single or multiple quantum well structure. In various embodiments, a cladding layer (not shown) doped with a conductive dopant may be formed on and/or under the active layer 12. For example, the cladding layer may be implemented as an AlGaN layer or an InAlGaN layer. Materials such as AlGaN and AlInGaN may be used as the active layer 12.

In case that an electric field equal to or greater than a predetermined voltage is applied to both ends of the light emitting element LD, the light emitting element LD may emit light by a combination of electron-hole pairs in the active layer 12.

The second semiconductor layer 13 may be disposed on the active layer 12 and may include a semiconductor layer of a different type from the first semiconductor layer 11. For example, the second semiconductor layer 13 may include at least one p-type semiconductor layer. For example, the second semiconductor layer 13 may include at least one semiconductor material such as InAlGaN, GaN, AlGaN, InGaN, AlN, and InN, and may be doped with a second conductive dopant such as Mg.

However, the material constituting the second semiconductor layer 13 is not limited thereto. The second semiconductor layer 13 may be formed of various materials.

According to an embodiment, the light emitting element LD may further include a phosphor layer, another active layer, another semiconductor layer, and/or an electrode layer formed on and/or under each of the first semiconductor layer 11, the active layer 12, and the second semiconductor layer 13.

In an embodiment, the light emitting element LD may further include at least one electrode layer disposed at one end (for example, an upper surface) of the second semiconductor layer 13 or at one end (for example, a lower surface) of the first semiconductor layer 11.

For example, as shown in FIG. 1B, the light emitting element LD may further include an electrode layer 15 disposed on one end of the second semiconductor layer 13. The electrode layer 15 may be an ohmic contact electrode, but the examples of the electrode layer 15 are not limited thereto. The electrode layer 15 may include a metal or a metal oxide. For example, the electrode layer 15 may include chromium (Cr), titanium (Ti), aluminum (Al), gold (Au), nickel (Ni), ITO, and oxides or alloys thereof. The above-described materials may be used alone or in combination, but the examples of the material are not limited thereto. The electrode layer 15 may be substantially transparent or translucent. Accordingly, the light generated by the light emitting element LD may penetrate the electrode layer 15 and may be emitted to the outside of the light emitting element LD.

The light emitting element LD may further include an insulating film 14. In an embodiment, the insulating film 14 may be disposed to surround a portion of the first semiconductor layer 11, the active layer 12, and the second semiconductor layer 13. In another embodiment, the insulating film 14 may be omitted.

For example, the insulating film 14 may be disposed at a portion other than ends of the light emitting element LD so that the ends of the light emitting element LD may be exposed.

For convenience of description, FIGS. 1A and 1B show that a portion of the insulating film 14 is removed. In embodiments of the light emitting electrode LD, all sides of the light emitting element LD may be surrounded by the insulating film 14.

The insulating film 14 may be disposed to surround the entire or at least a portion of an outer circumferential surface of the first semiconductor layer 11, the active layer 12, and/or the second semiconductor layer 13. For example, the insulating film 14 may be disposed to surround at least the outer circumferential surface of the active layer 12. In case that the light emitting element LD may include the electrode layer 15, the insulating film 14 may be disposed to surround at least a portion of an outer circumferential surface of the electrode layer 15.

The insulating film 14 may include a transparent insulating material. For example, the insulating film 14 may include one or more insulating materials selected from the group consisting of $SiO_2$, $Si_3N_4$, $Al_2O_3$, and $TiO_2$. However, the materials of the insulating film 14 are not limited thereto, and various materials having insulating properties may be used as the insulating film 14.

In case that the insulating film 14 is provided to the light emitting element LD, the active layer 12 may be prevented from being shorted to the first and/or second electrodes (not shown).

By forming the insulating film 14, surface defects of the light emitting element LD may be minimized or mitigated, thereby improving lifetime and efficiency of the light emitting element LD. In case that multiple light emitting elements LD are disposed closely to each other in a display device, the insulating film 14 may prevent unwanted short circuits that may otherwise occur between the light emitting elements LD.

The light emitting element LD may be used as a light emitting source in various display devices. For example, the light emitting element LD may be used as a light source element of a lighting device or a self-emission display device.

Figure 2A:
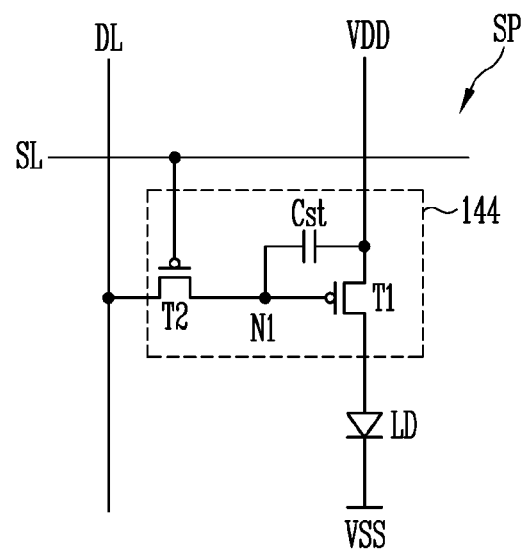
FIGS. 2A and 2B are schematic diagrams of equivalent circuit illustrating a light emitting region of a display device according to an embodiment.
Figure 2B:
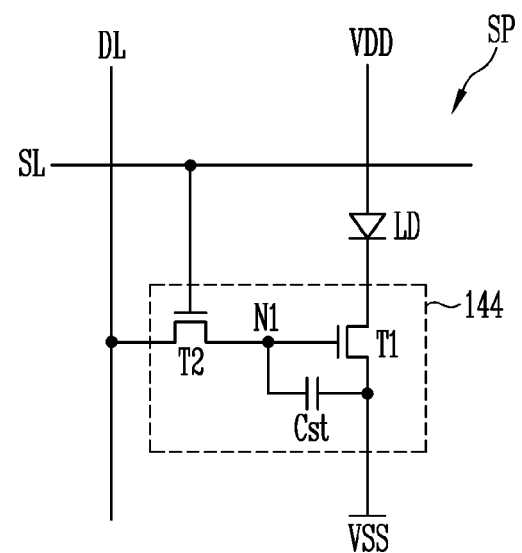

FIGS. 2A and 2B are schematic diagrams of equivalent circuit illustrating a light emitting region of a display device according to an embodiment.

FIGS. 2A and 2B show examples of a pixel in an active light emitting display panel. As an example, the light emitting region may be a pixel region in which a sub-pixel is disposed.

Referring to FIG. 2A, a sub-pixel SP may include at least one light emitting element LD, and a pixel driving circuit 144 electrically connected thereto to drive the light emitting element LD.

A first electrode (for example, an anode) of the light emitting element LD may be electrically connected to a first driving power source VDD via the pixel driving circuit 144, and a second electrode (for example, a cathode) of the light emitting element LD may be electrically connected to a second driving power source VSS.

The first driving power source VDD and the second driving power source VSS may have different potentials. For example, in comparison with the potential of the first driving power source VDD, the potential of the second driving power source VSS may be as low as a threshold voltage of the light emitting element LD.

Each light emitting element LD may emit light at a luminance corresponding to a driving current controlled by the pixel driving circuit 144.

FIG. 2A shows an example in which only one light emitting element LD is included in the sub-pixel SP, but the embodiments are not limited thereto. For example, the sub-pixel SP may include multiple light emitting elements LD electrically connected in parallel to each other.

According to an embodiment, the pixel driving circuit 144 may include a first transistor T1, a second transistor T2, and a storage capacitor Cst. However, the structure of the pixel driving circuit 144 is not limited to the embodiment shown in FIG. 2A.

The first transistor T1 (a driving transistor) may include a first electrode electrically connected to the first driving power source VDD and a second electrode electrically connected to the first electrode of each of the light emitting elements LD. A gate electrode of the first transistor T1 may be electrically connected to a first node N1. The first transistor T1 may control the amount of the driving current supplied to the light emitting element LD in response to the voltage of the first node N1.

The second transistor T2 (a switching transistor) may include a first electrode electrically connected to a data line DL and a second electrode electrically connected to the first node N1. The first electrode and the second electrode of the second transistor T2 may be different electrodes. For example, the first electrode may be a source electrode, and the second electrode may be a drain electrode. A gate electrode of the second transistor T2 may be electrically connected to a scan line SL.

The second transistor T2 may be turned on when a scan signal having a voltage (for example, a low voltage) at which the second transistor T2 is turned on is supplied from the scan line SL so that the data line DL and the first node N1 may be electrically connected to each other. At this time, a data signal of the corresponding frame may be supplied to the data line DL, and the data signal may be transmitted to the first node N1. The data signal transferred to the first node N1 may be charged in the storage capacitor Cst.

One electrode of the storage capacitor Cst may be electrically connected to the first driving power source VDD, and the other electrode of the storage capacitor Cst may be electrically connected to the first node N1. The storage capacitor Cst may be charged with a voltage corresponding to the data signal supplied to the first node N1, and the charged voltage may be maintained until the data signal of the next frame is supplied.

The components of the pixel driving circuit 144 are not limited to the structure shown in FIG. 2A. For example, the pixel driving circuit 144 may include the second transistor T2 for transferring the data signal into the sub-pixel SP, the storage capacitor Cst for storing the data signal, and the first transistor T1 for supplying the driving current corresponding to the data signal to the light emitting element LD.

In other embodiments, the components and the structure of the pixel driving circuit 144 may be variously modified. Also, the pixel driving circuit 144 may further include other circuit elements. For example, the pixel driving circuit 144 may further include at least one of a component for compensating a threshold voltage of the first transistor T1, a component for initializing the first node N1, and a component for controlling emitting light time of the light emitting element LD. In addition, the pixel driving circuit 144 may further include a boosting capacitor for boosting the voltage of the first node N1.

In FIG. 2A, the transistors included in the pixel driving circuit 144, for example, the first and second transistors T1 and T2, are illustrated as P-type transistors, but the types of the transistors are not limited thereto. For example, at least one of the first and second transistors T1 and T2 included in the pixel driving circuit 144 may be changed to an N-type transistor.

Referring to FIG. 2B, the first and second transistors T1 and T2 may be implemented as N-type transistors. The pixel driving circuit 144 shown in FIG. 2B may be similar in structure or operation to the pixel driving circuit 144 of FIG. 2A except that a connection position of some components is changed by changing the type of the transistor. Therefore, detailed description thereof will be omitted.

Figure 3:
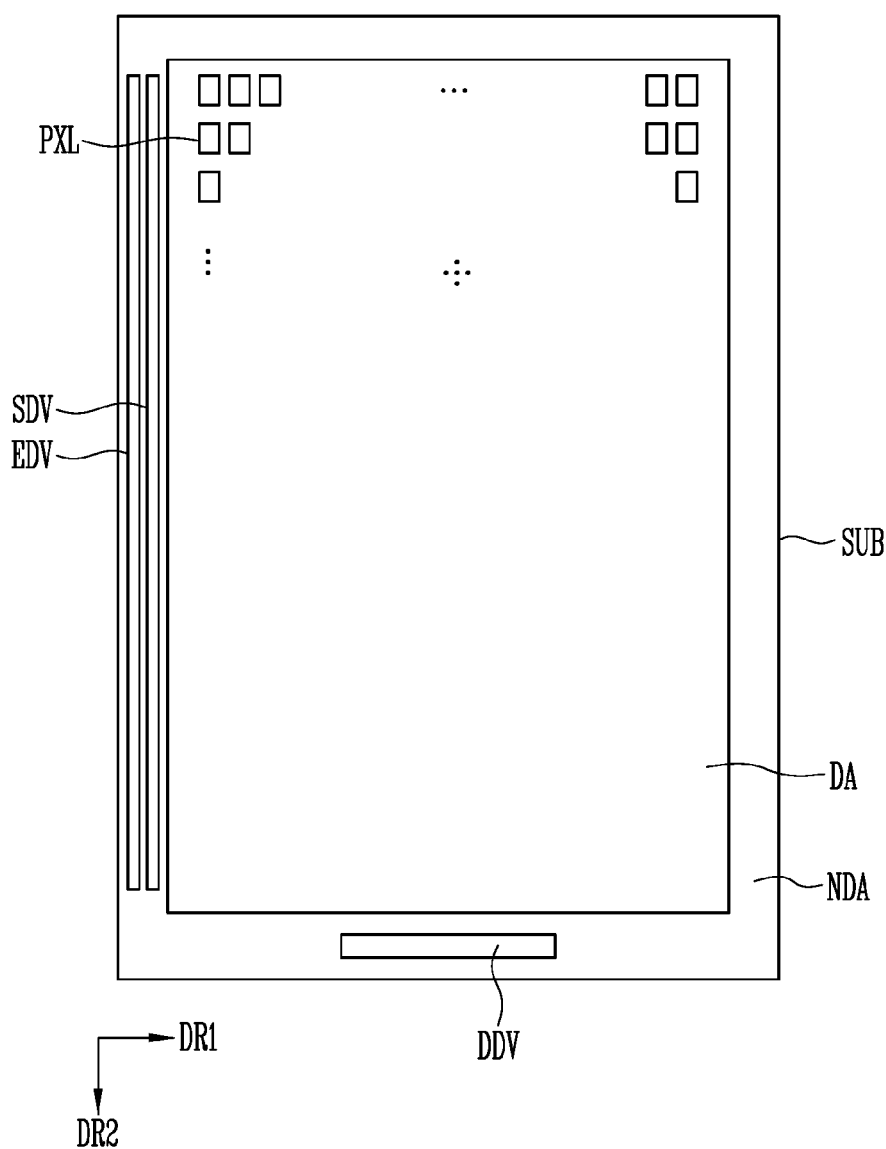
FIG. 3 is a schematic plan view illustrating the display device according to the embodiment.

FIG. 3 is a schematic plan view illustrating the display device according to an embodiment. The display device of this embodiment may include the light emitting element LD shown in FIG. 1A or 1B as a light emitting source.

Referring to FIGS. 1A, 1B and 3, the display device may include the substrate SUB, pixels PXL disposed on a surface of the substrate SUB, a driving unit disposed on the substrate SUB and driving the pixels PXL, and a wiring unit (not shown) connecting the pixels PXL to the driving unit.

The substrate SUB may include a display area DA and a non-display area NDA. The display area DA may be an area where the pixels PXL for displaying an image are disposed. The non-display area NDA may be an area in which the driving unit for driving the pixels PXL and a portion of the wiring unit for connecting the pixels PXL and the driving unit are disposed.

The pixels PXL may be disposed in the display area DA on the substrate SUB. Each of the pixels PXL may be disposed in plural as a unit for displaying the image. The pixels PXL may include the light emitting element LD that emits white light and/or color light. Each of the pixels PXL may emit light having one of red, green, and blue colors, but the embodiments are not limited thereto. For example, each of the pixels PXL may emit light having one of cyan, magenta, yellow, and white colors.

The pixels PXL may be disposed in plural and arranged in a matrix form along a row extending in a first direction DR1 and a column extending in a second direction DR2 crossing the first direction DR1. However, the arrangement of the pixels PXL is not particularly limited and may be arranged in various forms.

The driving unit may provide a signal to each of the pixels PXL through the wiring unit. Accordingly, the driving of each of the pixels PXL may be controlled.

The driving unit may include a scan driver SDV providing the scan signal to the pixels PXL through the scan line SL, an emission driver EDV providing an emission control signal to the pixels PXL through an emission control line, a data driver DDV providing the data signal to the pixels PXL through the data line DL, and a timing controller (not shown). The timing controller may control the scan driver SDV, the emission driver EDV, and the data driver DDV.

The display device according to an embodiment may be employed in various electronic devices. For example, the display device may be applied to wearable display devices, a television, a laptop, a mobile phone, a smart phone, a smart pad (PD), a PMP, a PDA, a navigation device, a smart watch, an automotive, a head-up display and the like.

Figure 5A:
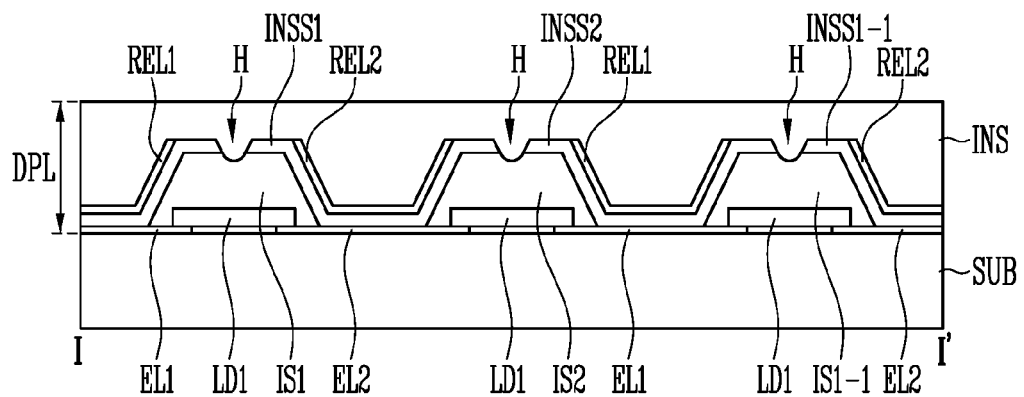
FIGS. 5A and 5B are schematic cross-sectional views taken along line I-I' of FIG. 4.
Figure 5B:
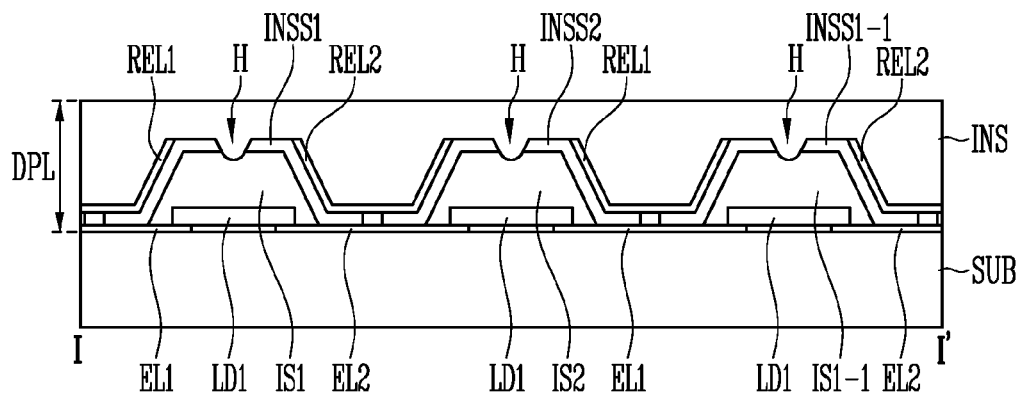

FIG. 4 is a schematic plan view illustrating a light emitting region of a display element layer according to an embodiment including the light emitting element of FIG. 1A or 1B. FIGS. 5A and 5B are schematic cross-sectional views taken along line I-I' of FIG. 4.

In FIG. 4, although first light emitting elements LD1 may be arranged in parallel in the first direction DR1, the arrangement of the first light emitting elements LD1 is not limited thereto. For example, the first light emitting elements LD1 may be aligned in an oblique direction with respect to the first direction DR1 between first and second electrodes EL1 and EL2.

Referring to FIGS. 4, 5A and 5B, a display element layer DPL may be disposed on the substrate SUB.

The substrate SUB may include a transparent insulating material to transmit light. The substrate SUB may be a rigid substrate or a flexible substrate. The rigid substrate may include a glass substrate, a quartz substrate, a glass ceramic substrate, and a crystalline glass substrate.

The flexible substrate may include a film substrate including a polymer organic material and a plastic substrate. For example, the flexible substrate may include at least one of polyethersulfone (PES), polyacrylate, polyetherimide (PEI), polyethylene naphthalate (PEN), polyethylene terephthalate (PET), Polyphenylene sulfide (PPS), polyarylate (PAR), polyimide (PI), polycarbonate (PC), triacetate cellulose (TAC), and cellulose acetate propionate (CAP). In addition, the flexible substrate may include fiber glass reinforced plastic (FRP).

The material applied to the substrate SUB may have resistance (or heat resistance) to a high processing temperature in the manufacturing process of the display device. In various embodiments, the substrate SUB may have flexibility in whole or at least a part thereof.

Referring to FIGS. 4, 5A and 5B, the display element layer DPL may include the first light emitting element LD1, the first electrode EL1, the second electrode EL2, an insulating structure INSS, and a reflective layer REL. The first electrode EL1 and the second electrode EL2 may be spaced apart from each other along the first direction DR1 on the substrate SUB. At least one first electrode EL1 and at least one second electrode EL2 may be disposed on the substrate SUB, and the first electrode EL1 and the second electrode EL2 may be alternately disposed along the first direction DR1. The display element layer DPL may include one or more insulating structure INSS.

The first electrode EL1 and the second electrode EL2 may include a transparent conductive material. For example, the transparent conductive material may include ITO, IZO, ITZO, or the like. However, materials of the first electrode EL1 and the second electrode EL2 are not limited to the above-described materials.

The insulating structure INSS having a convex shape protruding from the substrate SUB toward the display element layer DPL may be disposed on the substrate SUB. The insulating structure INSS may include a space IS, and the first light emitting element LD1 may be disposed in the space IS. The space may an internal space within the insulating structure INSS. The first light emitting element LD1, a portion of the first electrode EL1 electrically connected to a portion of the first light emitting element LD1, and a portion of the second electrode EL2 electrically connected to another portion of the first light emitting element LD1 may be positioned in the space IS of the insulating structure INSS.

The insulating structure INSS may include a transparent insulating material to transmit light. The insulating structure INSS may include one or more insulating materials selected from the group consisting of $SiO_2$, $Si_3N_4$, $Al_2O_3$, and $TiO_2$, but is not limited thereto, and various materials having transparent and insulating properties may be used.

According to an embodiment, the first light emitting element LD1 may be disposed in the space IS of the insulating structure INSS. Therefore, a ratio of providing the light emitting element LD per unit area on the substrate SUB may be increased in comparison with a conventional display device.

As the insulating structure INSS protrudes from the substrate SUB, the space IS may be formed as an empty space. For example, the space IS may include air. As the space IS of the insulating structure INSS is formed as the empty space filled with air, light emitted from the first light emitting element LD1 may be transmitted to a light conversion layer QDL described later without a trap. Detailed description thereof will be described later.

The insulating structure INSS may have a dome shape including the space IS separated from the outside. Referring to FIG. 4, the insulating structure INSS may have the dome shape extending in the second direction DR2 on the substrate SUB, and at least one first light emitting element LD1 may be disposed in the space IS of the insulating structure INSS having the dome shape.

However, the shape of the insulating structure INSS is not particularly limited to the embodiments shown in FIGS. 5A and 5B. Various shapes in which the space IS may be separated from the outside and the first light emitting element LD1 may be disposed in the space IS may be adopted.

The insulating structure INSS may include a hole H exposing the space IS. The hole H may be a penetration hole that penetrates the insulating structure INSS. The hole H may be disposed on an upper portion of the insulating structure INSS. However, the position of the hole H is not particularly limited. The hole H may be disposed in the insulating structure INSS of a portion exposed by a reflective layer REL.

The insulating structure INSS may include at least one hole H. For example, holes H may be disposed in the insulating structure INSS to be spaced apart from each other along the second direction DR2. The diameter of the hole H may be larger than that of the first light emitting element LD1. As described later, the first light emitting element LD1 may be introduced into the space IS of the insulating structure INSS through the hole H.

In various embodiments, the display element layer DPL may include multiple insulating structures, for example, a first insulating structure INSS1 and a second insulating structure INSS2 adjacent to each other. The first light emitting element LD1 may be disposed in a first space IS1 of the first insulating structure INSS1, and the first light emitting element LD1 may be disposed in a second space IS2 of the second insulating structure INSS2. The first and second spaces IS1 and IS2 may be internal spaces within the first and second insulating structures INSS1 and INSS2, respectively.

Referring to FIG. 4, the first insulating structure INSS1 and the second insulating structure INSS2 may be disposed adjacent to each other, and the second insulating structure INSS2 and a (1-1)th insulating structure INSS1-1 may be disposed adjacent to each other. The first insulating structure INSS1 and the (1-1)th insulating structure INSS1-1 may be electrically connected to a first connection line CNL1, and the second insulating structure INS2 may be electrically connected to a second connection line CNL2. The first insulating structure INSS1 and the (1-1)th insulating structure INSS1-1 may be integrally formed with the first connection line CNL1, and the second insulating structure INSS2 may be integrally formed with the second connection line CNL2.

In various embodiments, the first electrode EL1 or the second electrode EL2 may be disposed between the first insulating structure INSS1 and the second insulating structure INSS2. Referring to FIGS. 5A and 5B, the second electrode EL2 may be disposed between the first insulating structure INSS1 and the second insulating structure INSS2 adjacent to each other, and the first electrode EL1 may be disposed between the second insulating structure INSS2 and the (1-1)th insulating structures INSS1-1 adjacent to each other. The above-described structure may be repeatedly disposed along the first direction DR1 on the substrate SUB.

In various embodiments, between the first insulating structure INSS1 and the second insulating structure INSS2, a first portion of the first electrode EL1 or the second electrode EL2 may be electrically connected to the first light emitting element LD1 in the first space IS1 of the first insulating structure INSS1, and a second portion of the first electrode EL1 or the second electrode EL2 may be electrically connected to the first light emitting element LD1 in the second space IS2 of the second insulating structure INSS2.

Referring to FIGS. 5A and 5B, the second electrode EL2 may be disposed between the first insulating structure INSS1 and the second insulating structure INSS2. The first portion of the second electrode EL2 may be electrically connected to the first light emitting element LD1 disposed in the first space IS1 of the first insulating structure INSS1. A second portion of the second electrode EL2 may be electrically connected to the first light emitting element LD1 disposed in the second space IS2 of the second insulating structure INSS2.

The first electrode EL1 may be disposed between the second insulating structure INSS2 and the (1-1)th insulating structure INSS1-1. The first portion of the first electrode EL1 may be electrically connected to the first light emitting element LD1 disposed in the second space IS2 of the second insulating structure INSS2. The second portion of the first electrode EL1 may be electrically connected to the first light emitting element LD1 disposed in a (1-1)th space IS1-1 of the (1-1)th insulating structure INSS1-1.

In an embodiment, the above-described structure may be repeatedly disposed along the first direction DR1 on the substrate SUB.

In various embodiments, the insulating structure INSS may be disposed on the first electrode EL1 and the second electrode EL2. For example, one end of the insulating structure INSS may be disposed on the first electrode EL1, the other end of the insulating structure INSS may be disposed on the second electrode EL2, and a central portion of the insulating structure INSS may be spaced apart from the substrate SUB.

In an embodiment, the insulating structure INSS may have a structure that is continuous on the first electrode EL1 and the second electrode EL2. Referring to FIGS. 5A and 5B, one end of the first insulating structure INSS1 and one end of the second insulating structure INSS2 may be electrically connected to each other on the second electrode EL2, and the other end of the second insulating structure INSS2 and one end of the (1-1)th insulating structure INSS1-1 may be electrically connected to each other on the first electrode EL1. The structure in which the insulating structure INSS is continuous on the first electrode EL1 and the second electrode EL2 may be disposed for each light emitting region (for example, a pixel area provided with one sub-pixel SP) of the display element layer DPL.

In various embodiments, the display element layer DPL may include a reflective layer REL disposed on an outer surface of the insulating structure INSS and reflecting light emitted from the first light emitting element LD1. For example, the reflective layer REL may be disposed on the outer surface of the insulating structure INSS facing the first and second portions of the first light emitting element LD1 disposed in the space IS.

The reflective layer REL may reflect the light emitted from the first light emitting element LD1 included in the display element layer DPL. For example, the reflective layer REL may reflect the light emitted from the first light emitting element LD1 disposed in the space IS of the insulating structure INSS to the light conversion layer QDL. The reflective layer REL may reflect light emitted from the second light emitting element LD2 disposed between the insulating structures INSS adjacent to each other to the light conversion layer QDL.

The reflective layer REL may include a conductive material having high light reflectance. For example, the reflective layer REL may include a single film made of Ag or a triple film including ITO/Ag/ITO.

In various embodiments, the reflective layer REL may include a first reflective layer REL1 overlapping the first electrode EL1 and a second reflective layer REL2 overlapping the second electrode EL2. The first reflective layer REL1 may be electrically connected to the first electrode EL1, and the second reflective layer REL2 may be electrically connected to the second electrode EL2.

Referring to FIG. 5B, between the first insulating structure INSS1 and the second insulating structure INSS2, the second reflective layer REL2 overlapping the second electrode EL2 may be electrically connected to the second electrode EL2 through a contact hole. Between the second insulating structure INSS2 and the (1-1)th insulating structure INSS1-1, the first reflective layer REL1 overlapping the first electrode EL1 may be electrically connected to the first electrode EL1 through a contact hole.

In an embodiment, the first insulating structure INSS1 and the second insulating structure INSS2 adjacent to each other may share the electrode EL and the reflective layer REL disposed between the first insulating structure INSS1 and the second insulating structure INSS2. For example, the first electrode EL1 or the second electrode EL2 may be disposed between the first insulating structure INSS1 and the second insulating structure INSS2. The first portion of the electrode (for example, the second electrode EL2) disposed between the first insulating structure INSS1 and the second insulating structure INSS2 may be disposed in the first space IS1 of the first insulating structure INSS1, and the second portion of the second electrode EL2 may be disposed in the second space IS2 of the second insulating structure INSS2. The second reflective layer REL2 overlapping the second electrode EL2 may be disposed in a continuous state between the first insulating structure INSS1 and the second insulating structure INSS2.

The display element layer DPL may include an insulating layer INS disposed on the insulating structure INSS. The insulating layer INS may prevent oxygen, moisture, and the like from penetrating into the first light emitting element LD1 and the reflective layer REL to prevent corrosion. The insulating layer INS may include any one of an inorganic insulating material and an organic insulating material.

The light emitted from the first light emitting element LD1 may travel toward the light conversion layer QDL through the space IS of the insulating structure INSS and the insulating layer INS. In this case, the space IS of the insulating structure INSS may be a low refractive index area made of air, and the insulating layer INS may be a high refractive index area. As the light emitted from the first light emitting element LD1 passes through the space IS, which is the low refractive index area, and then passes through the insulating layer INS, which is the high refractive index area, the light emitted from the first light emitting element LD1 may travel toward the light conversion layer QDL without the trap.

Figure 6:
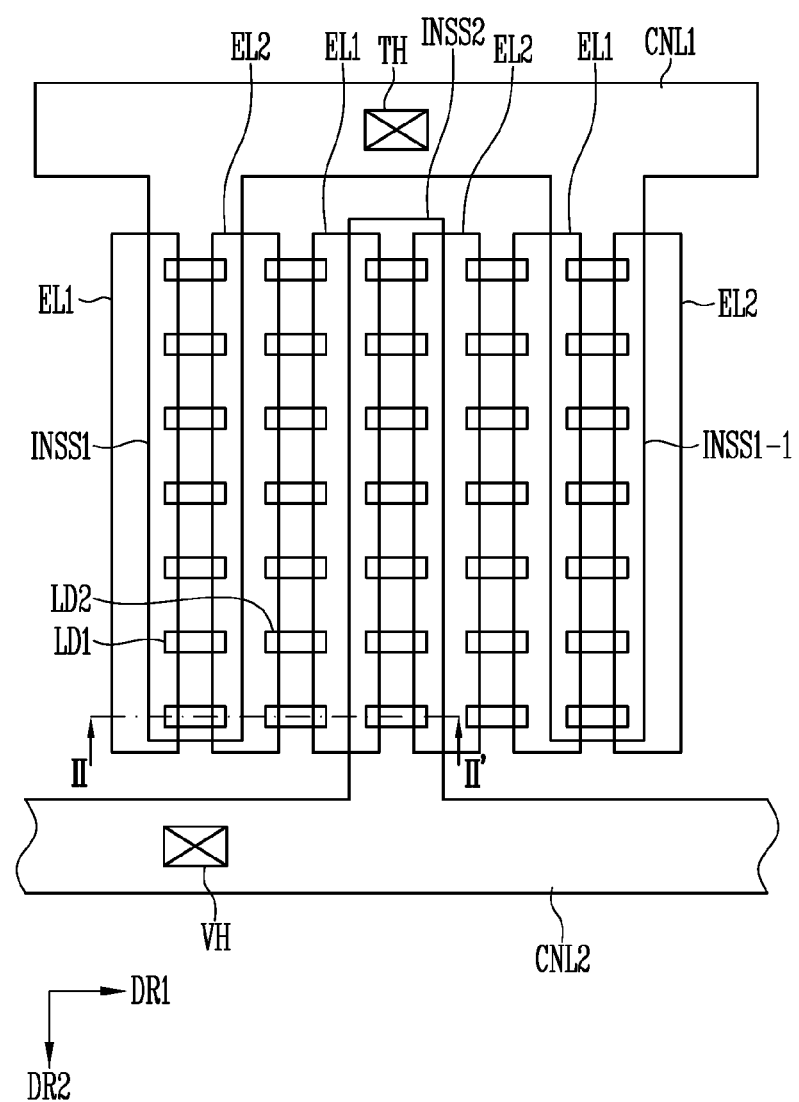
FIG. 6 is a schematic plan view illustrating a light emitting region of a display element layer according to another embodiment including the light emitting element of FIG. 1A or 1B.
Figure 7:
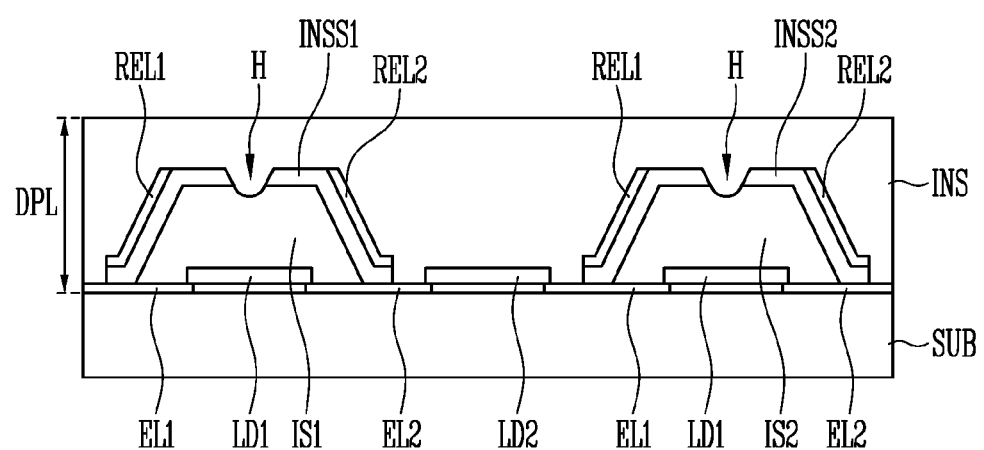
FIG. 7 is a schematic cross-sectional view taken along line II-II' of FIG. 6.

FIG. 6 is a schematic plan view illustrating a light emitting region of a display element layer according to another embodiment including the light emitting element of FIG. 1A or 1B. FIG. 7 is a schematic cross-sectional view taken along line II-II' of FIG. 6. Configurations not specifically described in this embodiment are in accordance with the above-described embodiments. The same reference numerals refer to the same components, and similar reference numerals refer to similar components.

Referring to FIGS. 6 and 7, the display element layer DPL may include the first light emitting element LD1, the second light emitting element LD2, the first electrode EL1, the second electrode EL2, the insulating structure INSS, and the reflective layer REL. The display element layer DPL may include multiple insulating structures, for example, the first insulating structure INSS1 and the second insulating structure INSS2 adjacent to each other. The first light emitting elements LD1 may be disposed in the first and second spaces IS1 and IS2 of the first insulating structure INSS1 and the second insulating structure INSS2, respectively.

Referring to FIGS. 6 and 7, the second light emitting element LD2 may be disposed between the first insulating structure INSS1 and the second insulating structure INSS2, and the second light emitting element LD2 may be disposed between the second insulating structure INSS2 and the (1-1)th insulating structure INSS1. In an embodiment compared to the above-described embodiments, the second light emitting element LD2 may be additionally disposed between the first and second insulating structures INSS1 and INSS2 adjacent to each other. The second light emitting element LD2 may be the same as or different from the first light emitting element LD1.

In an embodiment, the first insulating structure INSS1 and the second insulating structure INSS2 may expose portions of the first electrode EL1 and the second electrode EL2 to the outside of the insulating structure INSS, respectively. Referring to FIG. 7, the first portion of the second electrode EL2 may be positioned in the first space IS1 of the first insulating structure INSS1, and the second portion of the second electrode EL2 may be positioned outside the first insulating structure INSS1. In addition, the first portion of the first electrode EL1 may be positioned in the second space IS2 of the second insulating structure INSS2, and the second portion of the first electrode EL1 may be positioned outside the second insulating structure INSS2.

The second light emitting element LD2 may be electrically connected to a portion of the first electrode EL1 and a portion of the second electrode EL2 that are adjacent to each other and are exposed between the first insulating structure INSS1 and the second insulating structure INSS2.

According to the embodiment, the first light emitting element LD1 may be disposed in the space IS of the insulating structure INSS, and the second light emitting element LD2 may be disposed between the insulating structures INSS adjacent to each other. Therefore, the ratio of providing the light emitting element LD per unit area on the substrate SUB may increase. As a result, the display element layer DPL may emit more light per unit area. This may improve quality of the image output from the display device.

In an embodiment, the insulating structures INSS adjacent to each other may independently include the first electrode EL1, the second electrode EL2, and the reflective layer REL. Referring to FIG. 7, each of the first insulating structure INSS1 and the second insulating structure INSS2 adjacent to each other may independently include the first electrode EL1, the second electrode EL2, and the reflective layer REL1. Each of the first electrode EL1, the second electrode EL2, and the reflective layer REL included in the first insulating structure INSS1 may be electrically insulated from each of the first electrodes EL1, the second electrode EL2, and the reflective layer REL included in the second insulating structure INSS2.

Figure 8:
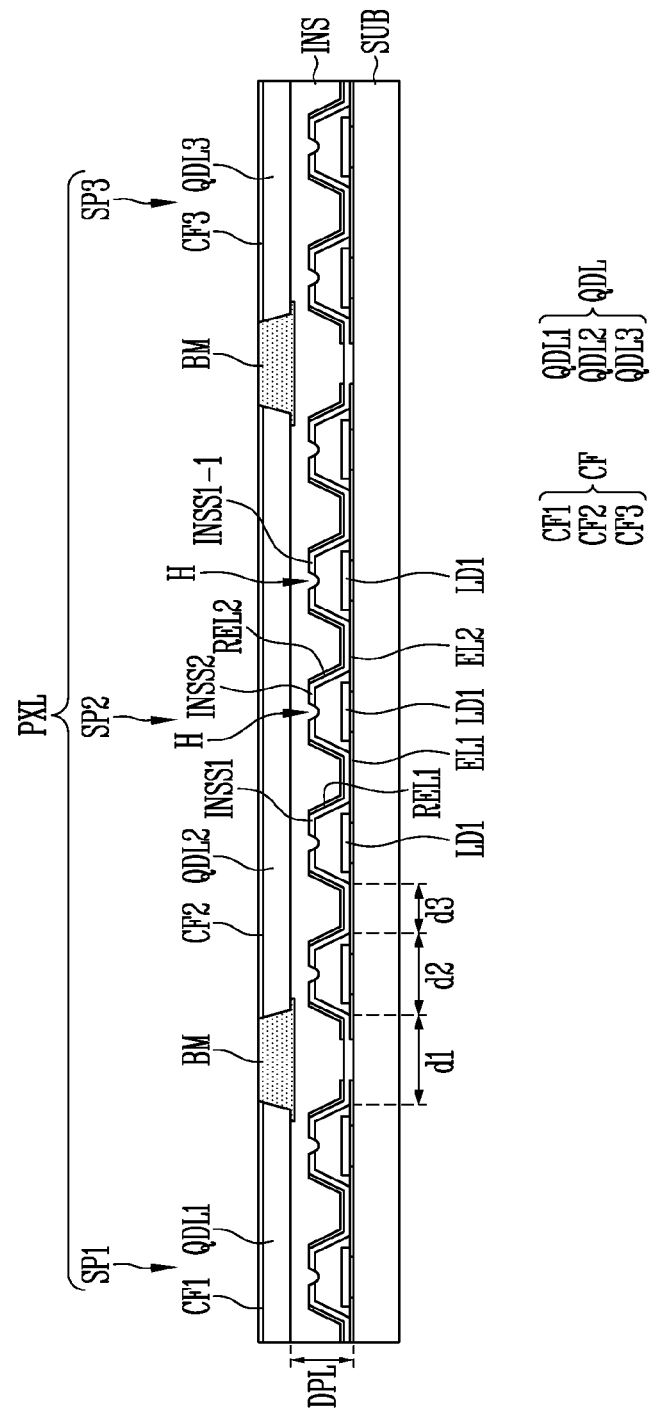
FIG. 8 is a schematic cross-sectional view illustrating a display element layer and a light conversion layer according to an embodiment.
Figure 9:
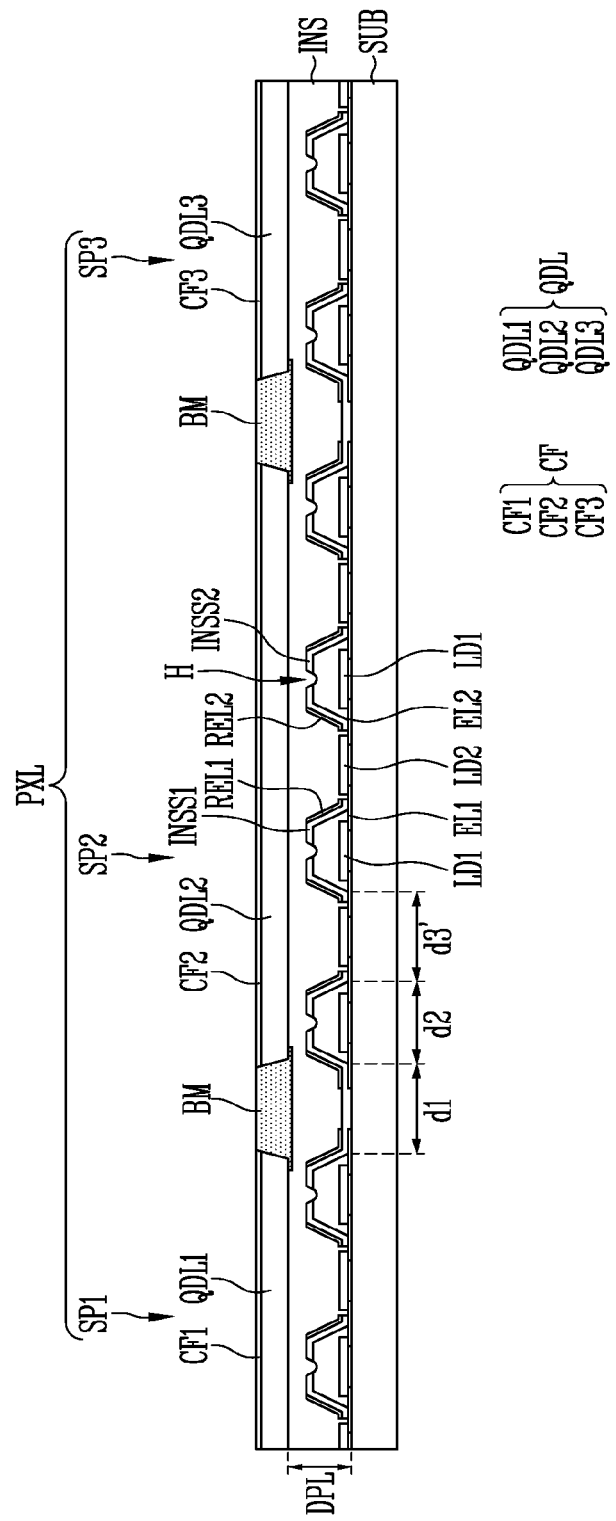
FIG. 9 is a schematic cross-sectional view illustrating a display element layer and a light conversion layer according to another embodiment.

FIG. 8 is a schematic cross-sectional view illustrating a display element layer and a light conversion layer according to an embodiment. FIG. 9 is a schematic cross-sectional view illustrating a display element layer and a light conversion layer according to another embodiment.

In various embodiments, the light conversion layer QDL for converting light emitted from the light emitting element LD may be disposed on the display element layer DPL. The light conversion layer QDL may include wavelength conversion particle for converting wavelength of incident light. The wavelength conversion particle may be, for example, a quantum dot (QD), a fluorescent material, or a phosphorescent material. However, the examples of the wavelength conversion particle are not limited thereto. The light conversion layer QDL may contain a single or multiple well structure material. Referring to FIGS. 8 and 9, each of the pixels PXL may include a first sub pixel SP1, a second sub pixel SP2, and a third sub pixel SP3 disposed on the substrate SUB. Each of the first to third sub-pixels SP1, SP2, and SP3 may include the first light emitting element LD1, the second light emitting element LD2, the first electrode EL1, the second electrode EL2, the insulating structure INSS, and the reflective layer REL.

Black matrixes BM may be disposed at boundaries between the first to third sub pixels SP1, SP2, and SP3, so that regions of the first to third sub pixels SP1, SP2, and SP3 may be divided.

The light conversion layer QDL may include a first light conversion layer QDL1 overlapping the first sub pixel SP1, a second light conversion layer QDL2 overlapping the second sub pixel SP2, and a third light conversion layer QDL3 overlapping the third sub pixel SP3. The first to third light conversion layers QDL1, QDL2, and QDL3 may convert incident light into different wavelengths. For example, the first light conversion layer QDL1 may convert the incident light into a red wavelength and emit the red light, the second light conversion layer QDL2 may convert the incident light into a green wavelength and emit the green light, and the third light conversion layer QDL3 may convert the incident light into a blue wavelength and emit the blue light. However, the wavelength converted in the light conversion layer QDL is not limited to the above-described embodiment, and may be appropriately changed according to the wavelength of the light emitted from the first light emitting element LD1 and the second light emitting element LD2.

In various embodiments, a color filter CF may be disposed on the light conversion layer QDL. The color filter CF may include a first color filter CF1 overlapping the first light conversion layer QDL1, a second color filter CF2 overlapping the second light conversion layer QDL2, and a third color filter CF3 overlapping the third light conversion layer QDL3. Wavelengths of light emitted from the first to third color filters CF1, CF2, and CF3 may be different from each other. For example, the first color filter CF1 may emit light of red wavelength from incident light, the second color filter CF2 may emit light of green wavelength from incident light, and the third color filter CF3 may emit light of blue wavelength from incident light.

Referring to FIGS. 8 and 9, a distance d1 at which the regions of the first to third sub-pixels SP1, SP2, and SP3 may be divided by the black matrixes BM may be about 5 μm to about 7 μm. However, the distance d1 is not particularly limited to the above-described range, and may be changed according to a design of the display element layer DPL. A lower length d2 of the space IS in which the first light emitting element LD1 is disposed in the insulating structure INSS may be about 5 μm to about 10 μm. However, the length d2 is not particularly limited to the above-described range, and may be changed according to a length of the first light emitting element LD1.

Referring to FIG. 8, a distance d3 between the first insulating structure NSS1 and the second insulating structure NSS2 adjacent to each other may be about 3 μm to about 5 μm. However, the distance d3 is not particularly limited to the above-described range, and may be changed according to the design of the display element layer DPL.

Referring to FIG. 9, a distance d3' between the first insulating structure NSS1 and the second insulating structure NSS2 adjacent to each other may be about 5 μm to about 10 μm. However, the distance d3' is not particularly limited to the above-described range and may be changed according to a length of the second light emitting element LD2.

Figure 10A:
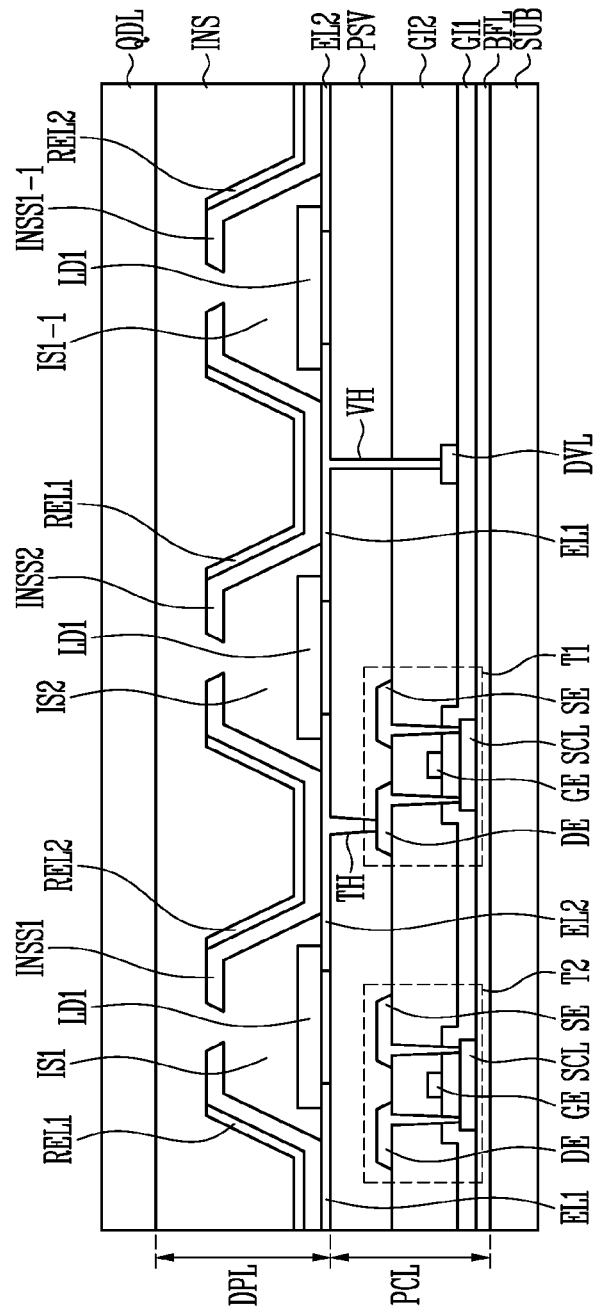
FIG. 10A is a schematic cross-sectional view illustrating the display device according to an embodiment.
Figure 10B:
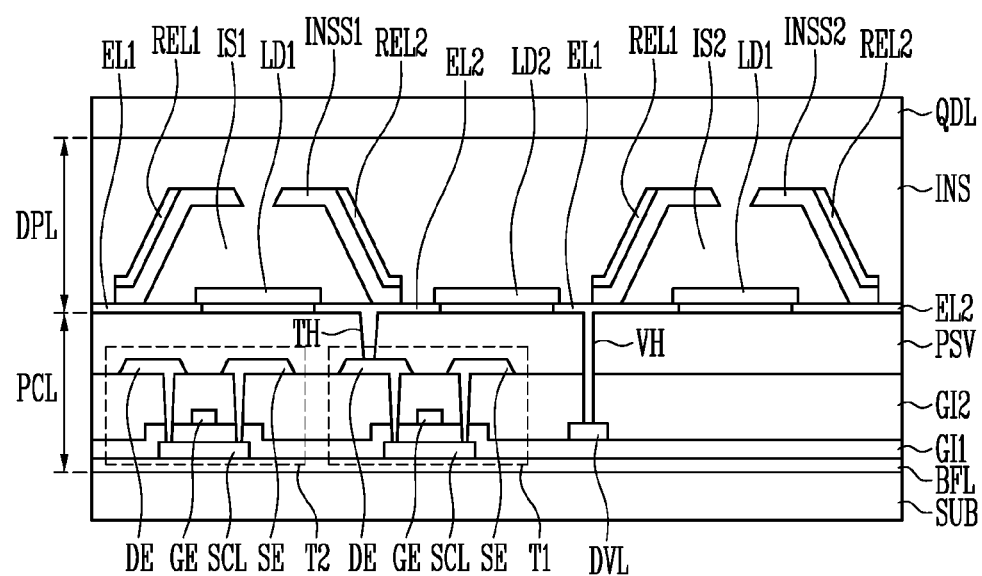
FIG. 10B is a schematic cross-sectional view illustrating the display device according to an embodiment.

FIG. 10A is a schematic cross-sectional view illustrating the display device according to an embodiment. FIG. 10B is a schematic cross-sectional view illustrating the display device according to an embodiment.

Referring to FIGS. 10A and 10B, the display device may include the substrate SUB, the pixel circuit layer PCL, the display element layer DPL, and the light conversion layer QDL.

The pixel circuit layer PCL may include a buffer layer BFL, the first transistor T1, the second transistor T2, and a driving voltage line DVL.

The buffer layer BFL may be disposed on one surface of the substrate SUB. The buffer layer BFL may prevent impurities from being diffused into the first and second transistors T1 and T2. The buffer layer BFL may be provided as a single layer or may be provided as multiple layers including at least two layers. In case that the buffer layer BFL is formed of the multiple layers, each layer may be formed of the same material or different materials. The buffer layer BFL may be omitted depending on material of the substrate SUB and process conditions.

The first transistor T1 may be the driving transistor electrically connected to the light emitting element LD to drive the light emitting element LD. The second transistor T2 may be the switching transistor electrically connected to the first transistor T1 to switch the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a source region and a drain region that are in contact with the corresponding source and drain electrodes SE and DE, respectively. A region between the source region and the drain region may be a channel region. The semiconductor layer SCL may be a semiconductor pattern made of polysilicon, amorphous silicon, an oxide semiconductor, or the like. The channel region may be a semiconductor pattern doped with an impurity. As impurities, n-type impurities, p-type impurities, metal impurities, and the like may be used.

The gate electrode GE may be disposed on the semiconductor layer SCL with a first gate insulating layer GI1 disposed between the gate electrode GE and the semiconductor layer SCL.

The source electrode SE and the drain electrode DE included in the first transistor T1 may be electrically connected to the source region and the drain region of the corresponding semiconductor layer SCL through contact holes penetrating a second gate insulating layer GI2 and the first gate insulating layer GI1, respectively.

The source electrode SE and the drain electrode DE included in the second transistor T2 may be electrically connected to the source region and the drain region of the corresponding semiconductor layer SCL through contact holes penetrating the second gate insulating layer GI2 and the first gate insulating layer GI1, respectively.

The driving voltage line DVL may be disposed on the first gate insulating layer GI1. However, a position of the driving voltage line DVL is not particularly limited. A signal corresponding to a driving voltage may be supplied to the driving voltage line DVL from the driving unit.

The pixel circuit layer PCL may further include a passivation layer PSV covering the first and second transistors T1 and T2. The passivation layer PSV may include at least one of an inorganic insulating layer including an inorganic material and an organic insulating layer including an organic material. For example, the passivation layer PSV may include the inorganic insulating layer and the organic insulating layer formed on the inorganic insulating layer.

Referring to FIG. 10A, the first electrode EL1 and the second electrode EL2 of the display element layer DPL may be disposed on the passivation layer PSV of the pixel circuit layer PCL. One of the first electrode EL1 and the second electrode EL2 may be electrically connected to at least one of the transistors included in the pixel circuit layer PCL.

For example, the second electrode EL2 may be electrically connected to the drain electrode DE of the first transistor T1 through a first contact hole TH penetrating the passivation layer PSV. The first electrode EL1 adjacent to the second electrode EL2 may be electrically connected to the driving voltage line DVL through a second contact hole VH penetrating the passivation layer PSV and the second gate insulating layer GI2.

Referring to FIG. 10A, the second electrode EL2 disposed between the first insulating structure INSS1 and the second insulating structure INSS2 may be electrically connected to the drain electrode DE of the first transistor T1 through the first contact hole TH. In addition, the first electrode EL1 disposed between the second insulating structure INSS2 and the (1-1)th insulating structure INSS1-1 may be electrically connected to the driving voltage line DVL through the second contact hole VH.

As described above, the drain electrode DE of the first transistor T1 may be electrically connected to the second electrode EL2 through the first contact hole TH. Thus, the second electrode EL2 may receive a signal from the first transistor T1.

The driving voltage line DVL may be electrically connected to the first electrode EL1 through the second contact hole VH. Thus, the second electrode EL2 may receive a signal from the driving voltage line DVL.

Referring to FIG. 10A, a portion of the first light emitting element LD1 disposed in the second space IS2 of the second insulating structure INSS2 may contact the second electrode EL2 and another portion of the first light emitting element LD1 may contact the first electrode EL1. Accordingly, the first light emitting element LD1 may receive a predetermined voltage through the first electrode EL1 and the second electrode EL2. In case that an electric field equal to or greater than the predetermined voltage is applied to the ends (both the portions) of the first light emitting element LD1, the first light emitting element LD1 may emit light by a combination of electron-hole pairs in the active layer 12. The light emitted from the first light emitting element LD1 may be reflected by the reflective layer REL and transferred to the light conversion layer QDL.

Referring to FIG. 10B, the second electrode EL2, which is electrically connected to the first light emitting element LD1 disposed in the first space IS1 of the first insulating structure INSS1, may be electrically connected to the drain electrode DE of the first transistor T1 through the first contact hole TH. In addition, the first electrode EL1, which is electrically connected to the first light emitting element LD1 disposed in the second space IS2 of the second insulating structure INSS2, may be electrically connected to the driving voltage line DVL through the second contact hole VH.

The second light emitting element LD2 disposed between the first insulating structure INSS1 and the second insulating structure INSS2 may be electrically connected to the second electrode EL2 connected to the first transistor T1 and the first electrode EL1 connected to the driving voltage line DVL.

Although not shown in FIG. 10B, the first electrode EL1, which is electrically connected to the first light emitting element LD1 disposed in the first space IS1 of the first insulating structure INSS1, may be electrically contacted to another driving voltage line through a contact hole. The second electrode EL2, which is electrically connected to the first light emitting element LD1 disposed in the second space IS2 of the second insulating structure INSS2, may be electrically to a drain electrode of another first transistor through a contact hole.

The electric field equal to or greater than the predetermined voltage may be applied to both ends of each of the first light emitting element LD1 and the second light emitting element LD2, and thus, each of the first light emitting element LD1 and the second light emitting element LD2 may emit light by the combination of electron-hole pairs in the active layer 12 of each of the first light emitting element LD1 and the second light emitting element LD2. Light emitted from the first light emitting element LD1 and the second light emitting element LD2 may be reflected by the reflective layer REL and transferred to the light conversion layer QDL.

FIGS. 11A through 11H are schematic cross-sectional views illustrating a method of manufacturing a display device according to an embodiment. As an example, FIGS. 11A through 11H schematically illustrate a method of manufacturing the display device shown in FIG. 10B. Other embodiments of the display device, for example, as shown in FIG. 10A, may be manufactured by the similar method with appropriate changes without departing from the scope of the disclosure.

In the description of the method of manufacturing the display device, any description of the display device that is provided above will not be described to avoid redundant description. In the below description, the same reference numerals may refer to the same components, and similar reference numerals refer to similar components of the above described embodiments.

Figure 11A:
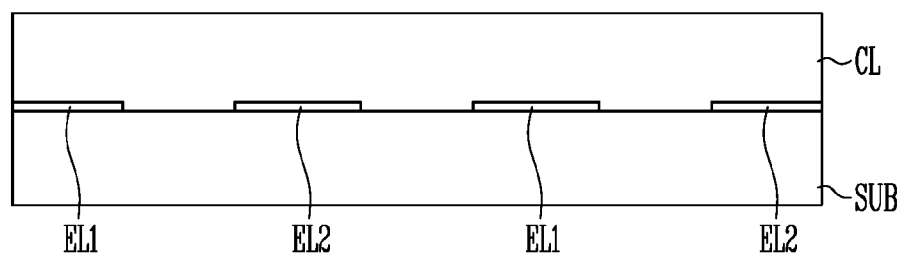
FIGS. 11A through 11H are schematic cross-sectional views sequentially illustrating a method of manufacturing a display device according to an embodiment.
Figure 11B:
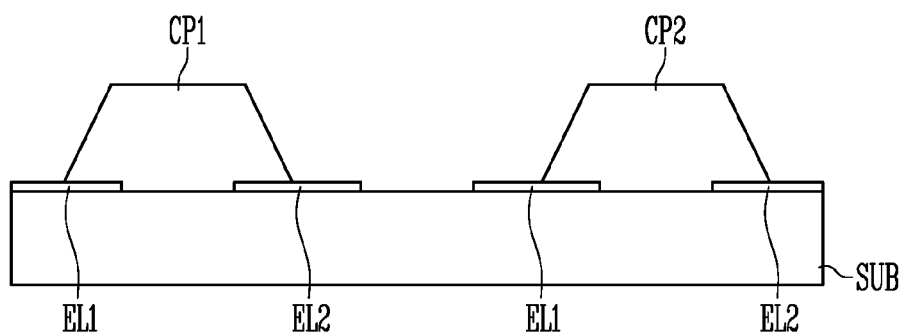
Figure 11C:
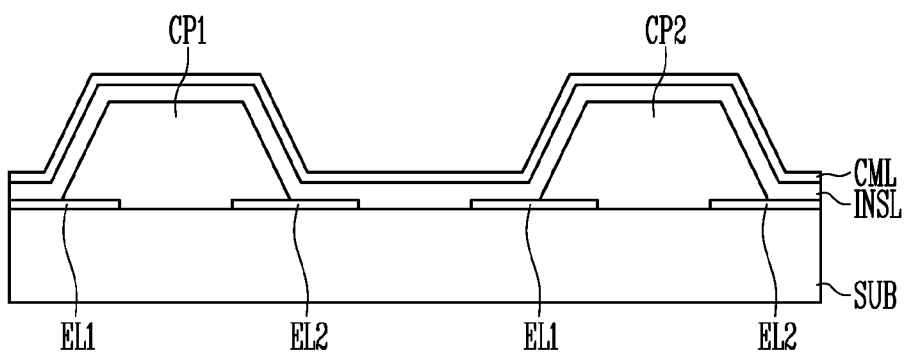

Referring to FIG. 11A, the first electrode EL1 and the second electrode EL2 spaced apart from each other may be formed on the substrate SUB. An electrode forming material may be deposited on the substrate SUB to form the first electrode EL1 and the second electrode EL2. For example, the first electrode EL1 and the second electrode EL2 may be formed by depositing the electrode forming material on the substrate SUB and etching the same. For example, the electrode forming material may be deposited in the form of the first electrode EL1 and the second electrode EL2.

A coating layer CL may be formed on the substrate SUB on which the first electrode EL1 and the second electrode EL2 are formed. In an embodiment, the coating layer CL may be formed on the first electrode EL1, the second electrode EL2, and the substrate SUB by applying a photoresist composition. The photoresist composition may be applied to the entire surface of the substrate SUB.

The photoresist composition may include components used to form the photoresist in the art. The photoresist composition may include, for example, an organic polymer, a solvent, a photosensitizer, or the like. However, the components included in the photoresist composition are not particularly limited thereto. The photoresist composition may further include additives such as colorants, dyes, anti-scratching agents, plasticizers, adhesion promoters, and the like. The photoresist composition may further include a surfactant for minimizing defects that may occur during coating (application) and improving coating properties.

As a method of applying the photoresist composition, conventional spinless coating, roll coating, spin coating, slit-and-spin coating, slit coating, etc. may be used, but the method of applying the photoresist composition is not limited thereto.

Referring to 11B, the coating layer CL may be patterned to form a pattern CP protruding from the substrate SUB and exposing a portion of the first electrode EL1 and a portion of the second electrode EL2. When the pattern CP is formed, the coating layer CL may be heat treated (for example, baked). The pattern CP may be formed by exposing and developing the coating layer CL using a mask.

The coating layer CL may be solidified by heat treating the coating layer CL. For example, the coating layer CL may be solidified by evaporating a solvent included in the photoresist composition used to form the coating layer CL. The coating layer CL may be heat treated at a temperature of about 80° C. to about 120° C., but the temperature for heat treatment is not limited thereto. The temperature for heat treatment of the coating layer CL may be set in various ways depending on a boiling point of the solvent included in the coating layer CL.

Thereafter, the coating layer CL is exposed and developed using the mask. As a result, the pattern CP having the convex shape protruding from the substrate SUB and exposing the portion of the first electrode EL1 and the portion of the second electrode EL2 may be formed.

The pattern CP may include a first pattern CP1 and a second pattern CP2 that are adjacent to each other, and the first pattern CP1 and the second pattern CP2 may expose the portion of the first electrode EL1 and the portion of the second electrode EL2, respectively.

Referring to 11C, an insulating layer INSL and a conductive material layer CIVIL may be sequentially formed on the first electrode EL1, the second electrode EL2, the pattern CP, and the substrate SUB. The insulating layer INSL may be formed using the chemical vapor deposition (CVD) method or the atomic layer deposition (ALD) method, but the method of forming the insulating layer INSL is not limited thereto. In an embodiment, the insulating layer INSL may be formed by depositing silicon nitride (SiNx) on the substrate SUB using the chemical vapor deposition method at a temperature of about 80° C. or less.

The conductive material layer CML may be formed on the insulating layer INSL. The conductive material layer CML may be formed by a deposition method such as chemical vapor deposition, plasma enhanced CVD (PECVD), low pressure CVD (LPCVD), physical vapor deposition (PVD), sputtering, atomic layer deposition (ALD), or the like.

In case that the conductive material layer CIVIL is formed, the conductive material layer CML may be electrically connected to the first electrode EL1 and the second electrode EL2. Before the conductive material layer CML is formed, contact holes (not shown) may be formed in the insulating layer INSL to expose the portion of the first electrode EL1 and the portion of the second electrode EL2. The conductive material layer CML may be disposed on the insulating layer INSL where the contact holes are formed, so that the conductive material layer CML may be electrically connected to the first electrode EL1 and the second electrode EL2 through the contact holes.

Figure 11D:
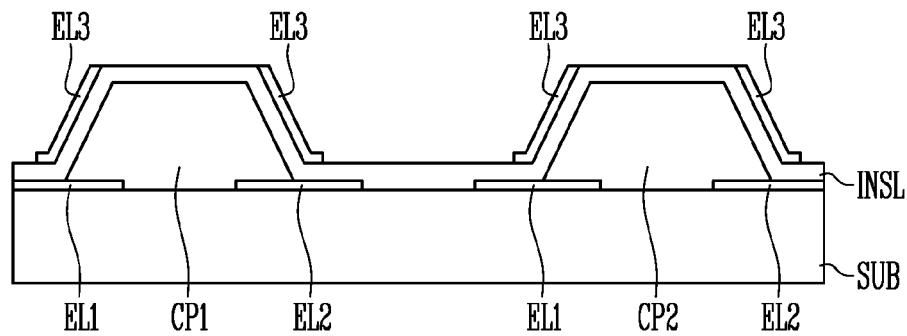
Figure 11E:
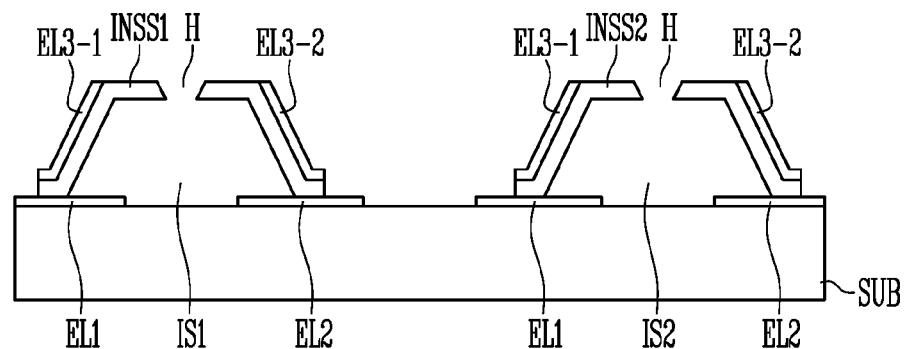

Referring to FIG. 11D, a third electrode EL3 may be formed by patterning the conductive material layer CML to expose a portion of the insulating layer INSL. For example, the third electrode EL3 may be formed by patterning the conductive material layer CML through a wet etching method using an etching mask. However, the method of patterning the conductive material layer CML is not limited thereto. The third electrode EL3 may be the reflective layer REL of the above-described embodiment.

In case that the third electrode EL3 is formed, the conductive material layer CML may be removed to expose the insulating layer INSL disposed on the pattern CP. The insulating layer INSL between the first pattern CP1 and the second pattern CP2 may be exposed by removing the conductive material layer CML between the first pattern CP1 and the second pattern CP2. Meanwhile, the display device shown in FIG. 10A may be manufactured by not removing the conductive material layer CML between the first pattern CP1 and the second pattern CP2.

Referring to 11E, in case that the insulating structure INSS is formed, the hole H exposing the pattern CP may be formed by patterning the insulating layer INSL exposed by removing the conductive material layer CML. The hole H may be formed in a portion of the insulating layer INSL exposed on the pattern CP. For example, the penetration hole H may be formed in the insulating layer INSL through a dry etching method using an etching mask. Thereafter, the pattern CP in the insulating layer INSL may be removed through the hole H. As a result, the insulating structure INSS having the convex shape protruding from the substrate SUB and including the space IS formed of the empty space may be formed. The first light emitting element LD1 may be aligned in the space IS.

In case that the insulating structure INSS is formed, the portion of the first electrode EL1 and the portion of the second electrode EL2 that are adjacent to each other between the first pattern CP1 and the second pattern CP2 may be exposed. For example, when the hole H is formed, the insulating layer INSL between the first pattern CP1 and the second pattern CP2 may be removed by the dry etching method. The second light emitting element LD2 may be aligned on the portion of the first electrode EL1 and the portion of the second electrode EL2 exposed between the first pattern CP1 and the second pattern CP2. This will be described later.

Figure 11F:
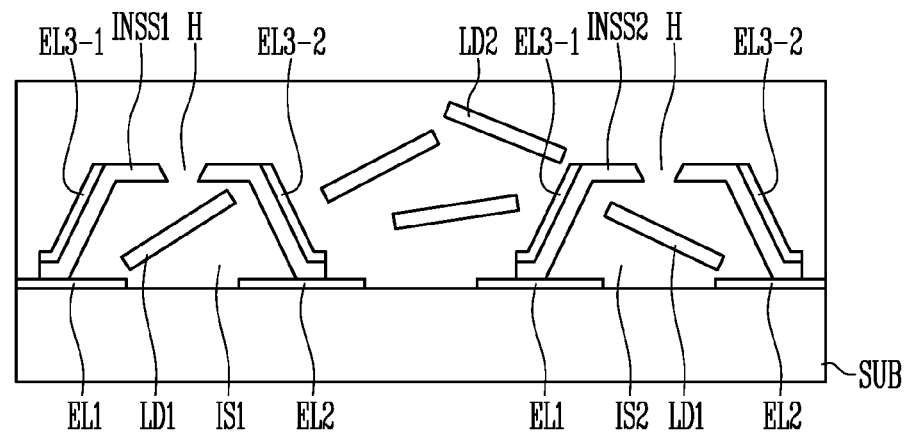

Referring to FIG. 11F, in case that the first light emitting element LD1 is disposed, the first light emitting element LD1 may be disposed in the space IS of the insulating structure INSS through the hole H. For example, by using the inkjet printing method, ink including the first light emitting element LD1 may be printed only on a portion where the hole H is formed. A diameter of the hole H may be larger than that of the first light emitting element LD1. Therefore, the first light emitting element LD1 may be introduced into the space IS of the insulating structure INSS through the hole H.

In an embodiment, the second light emitting element LD2 may be disposed between the first insulating structure INSS1 and the second insulating structure INSS2. Referring to FIG. 11F, the first light emitting elements LD1 may be disposed in the first and second spaces IS1 and IS2 of the first and second insulating structures INSS1 and INSS2, respectively, and the second light emitting element LD2 may be disposed between the first insulating structure INSS1 and the second insulating structure INSS2.

The second light emitting element LD2 may be simultaneously provided when the first light emitting element LD1 is provided. For example, solution including the first light emitting element LD1 and the second light emitting element LD2 may be coated on the entire surface of the substrate SUB by using the spin coating method or the like. The first light emitting element LD1 and the second light emitting element LD2 may be the same.

By using the inkjet printing method, a first ink including the first light emitting element LD1 may be printed only on a portion where the hole H is formed, and a second ink including the second light emitting element LD2 may be printed between the first insulating structure INSS1 and the second insulating structure INSS2. The first light emitting element LD1 and the second light emitting element LD2 may be the same or different.

In case that the first light emitting element LD1 is aligned, a voltage may be applied to the first electrode EL1, the second electrode EL2, and the third electrode EL3. Referring to FIG. 11F, in case that the voltage for alignment is applied to the first electrode EL1 and the second electrode EL2, an electric field may be formed between the first electrode EL1 and the second electrode EL2. In case that the first electrode EL1 and the second electrode EL2 are disposed on the same plane of the substrate SUB, an in-plan electric field may be formed between the first electrode EL1 and the second electrode EL2. In case that the voltage for alignment is applied to a (3-1)th electrode EL3-1 and a (3-2)th electrode EL3-2, an electric field may be formed between the (3-1)th electrode EL3-1 and the (3-2)th electrode EL3-2.

Accordingly, a stronger electric field may be formed in the first and second spaces IS1 and IS2 of the first and second insulating structures INSS1 and INSS2, and in a space between the first and second insulating structures INSS1 and INSS2. In addition, a direction of the electric field may be formed to be more parallel to the substrate SUB.

In the space IS of the insulating structure INSS, self-alignment of the first light emitting element LD1 may be induced by the electric fields formed between the first electrode EL1 and the second electrode EL2 and between the (3-1)th electrode EL3-1 and the (3-2)th electrode EL3-2.

Since the electric fields are formed between the first electrode EL1 and the second electrode EL2 and between the (3-1)th electrode EL3-1 and the (3-2)th electrode EL3-2, the alignment degree of the light emitting elements in the display element layer DPL may be improved.

In case that the first light emitting element LD1 is aligned, the voltage may be applied to the first electrode EL1 and the second electrode EL2. In case that the conductive material layer CML is formed, the conductive material layer CML may be electrically connected to the first electrode EL1 and the second electrode EL2. Referring to FIG. 11F, the (3-1)th electrode EL3-1 overlapping the first electrode EL1 may be electrically connected to the first electrode EL1 and the (3-2)th electrode EL3-2 overlapping the second electrode EL2 may be electrically connected to the second electrode EL2.

For example, in case that the first light emitting element LD1 is aligned, since the voltage for alignment is applied to the first electrode EL1 and the second electrode EL2, the electric fields may be formed between the first electrode EL1 and the second electrode and between the (3-1)th electrode EL3-1 and (3-2)th electrode EL3-2.

Figure 11G:
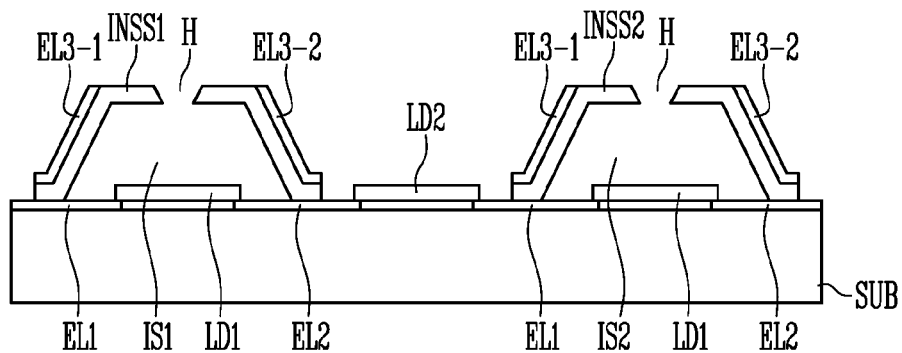

In an embodiment, the second light emitting element LD2 may be aligned with the first light emitting element LD1 at the same time. Referring to FIG. 11g, since the voltage is applied to the first electrode EL1, the second electrode EL2, the (3-1)th electrode EL3-1 and the (3-2)th electrode EL3-2, the electric fields may be formed between the first and second spaces IS1 and IS2 of the first and second insulating structures INSS1 and INSS2 and the space between the first insulating structure INSS1 and the second insulating structure INSS2. Accordingly, the first light emitting elements LD1 may be aligned in the first and second spaces IS1 and IS2 of the first and second insulating structures INSS1 and INSS2, and the second light emitting element LD2 may be aligned between the first insulating structure INSS1 and the second insulating structure INSS2.

Figure 11H:
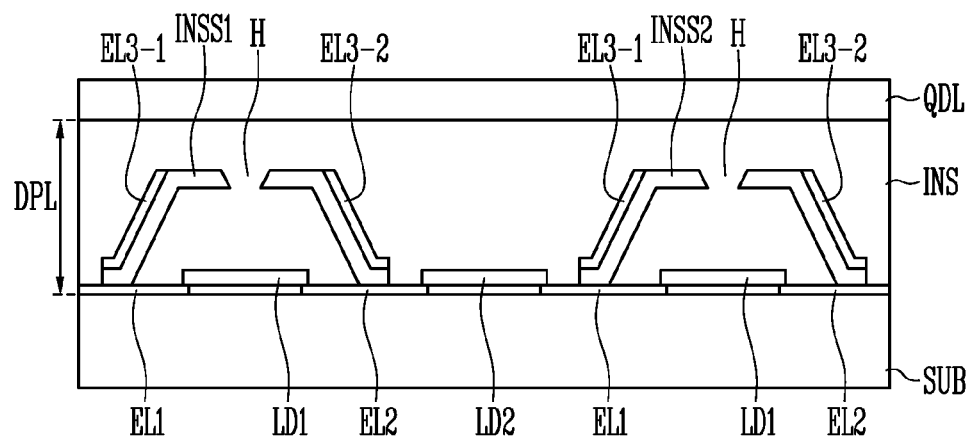

Referring to FIG. 11h, the insulating layer INS may be formed on the substrate SUB in which the light emitting element LD is aligned. The surface of the substrate SUB having the insulating structure INSS may be flattened by the insulating layer INS. The insulating 99999 layer INS may include any one of an inorganic insulating material and an organic insulating material. In case that the insulating layer INS is formed of the organic insulating material, since the organic insulating material has a predetermined viscosity, the organic insulating material may be prevented from flowing into the space IS through the hole H. In another embodiment, the diameter of the hole H may be reduced after the light emitting element LD is aligned.

The space IS may be exposed to the insulating layer INS through the hole H, but the space IS may be formed as the empty space filled with the air. As described above, as the space IS of the insulating structure INSS may be formed as the empty space, the light emitted from the first light emitting element LD1 may travel toward the light conversion layer QDL without the trap.

In various embodiments, the light conversion layer QDL for converting the light emitted from the first light emitting element LD1 may be disposed on the insulating structure INSS. The light conversion layer QDL may be disposed on the insulating layer INS.

Figure 12A:
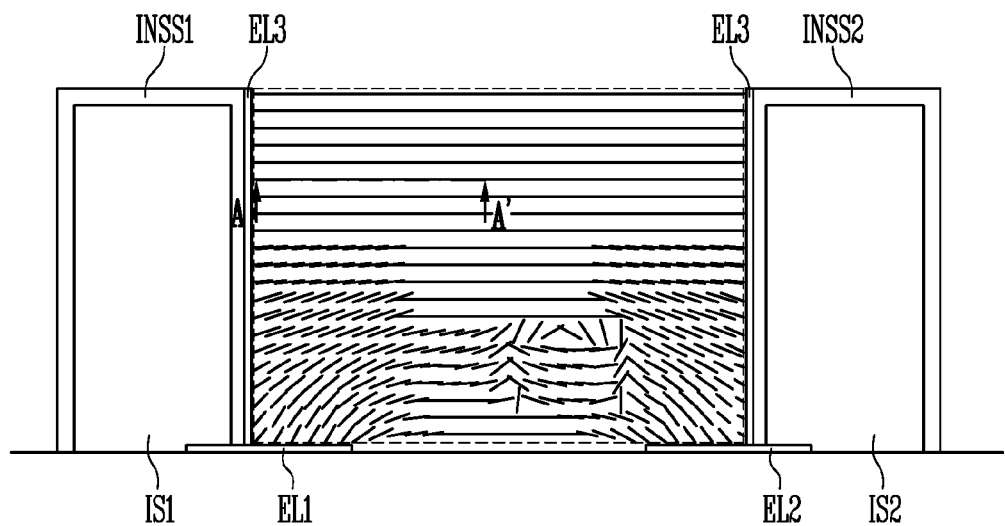
FIG. 12A is a schematic cross-sectional view illustrating an electric field formed between electrodes to which a voltage is applied to align the light emitting element according to the embodiment.
Figure 12B:
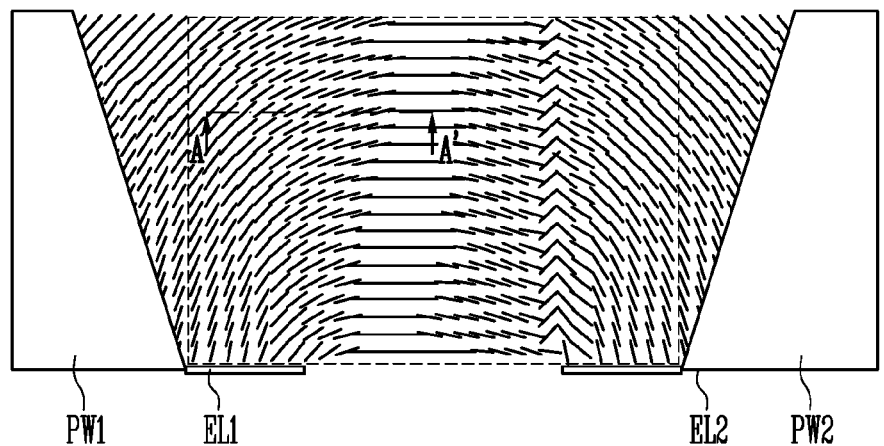
FIG. 12B is a schematic cross-sectional view illustrating an electric field formed between electrodes to which a voltage is applied to align a light emitting element according to a comparative example.
Figure 13:
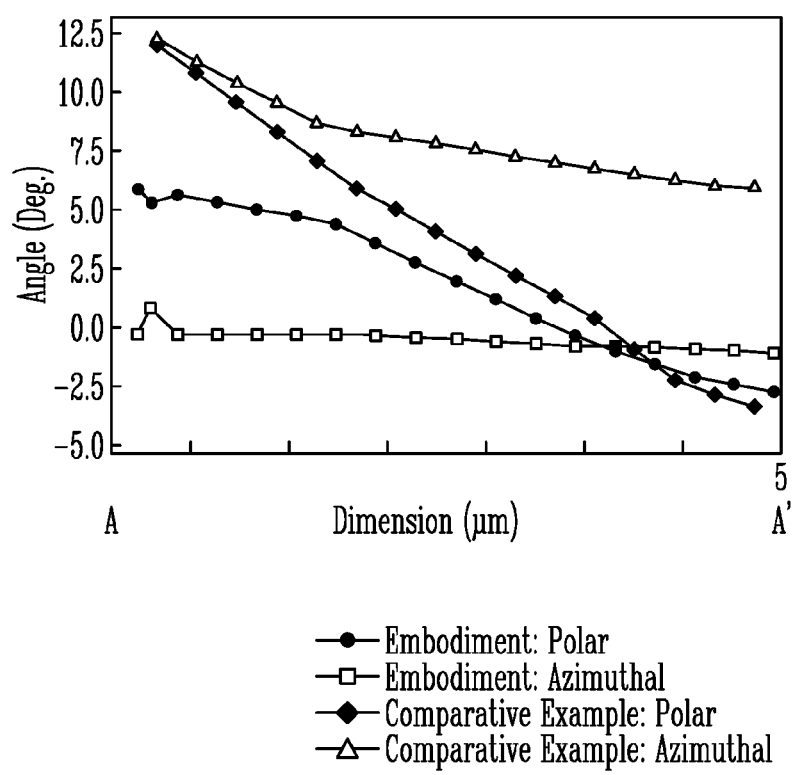
FIG. 13 is a graph showing angles of directions of electric fields in line A-A' of FIGS. 12A and 12B.

FIG. 12A is a schematic cross-sectional view illustrating an electric field formed between electrodes to which a voltage is applied to align the light emitting element according to the embodiment. FIG. 12B is a schematic cross-sectional view illustrating an electric field formed between electrodes to which a voltage is applied to align a light emitting element according to a comparative example. FIG. 13 is a graph showing angles of directions of electric fields in line A-A' of FIGS. 12A and 12B.

Specifically, FIG. 12A schematically illustrates a result of simulating a direction of the electric field formed between the first insulating structure INSS and the second insulating structure INSS2 when a voltage is applied to the first electrode EL1, the second electrode EL2, and the third electrode EL3 according to the embodiment. FIG. 12B schematically illustrates a result of simulating a direction of an electric field formed between a first partition wall PW1 and a second partition wall PW2 when a voltage is applied only to a first electrode EL1 and a second electrode EL2 to align a light emitting element according to a comparative example.

Referring to FIGS. 12A, 12B and 13, in the embodiment, an azimuthal angle in a direction of the electric field is maintained at about 0° in the line A-A', while in the comparative example, an azimuthal angle in a direction of the electric field is changed from about 12.5° to about 7.5° along the line A-A'. A shape in which the light emitting element LD is aligned may be determined according to the direction of the electric field. As the azimuth angle in the direction of the electric field is maintained at approximately 0°, the light emitting element LD may be aligned more parallel to the substrate SUB. The display device having excellent alignment degree of the light emitting elements LD may be implemented.

Figure 14A:
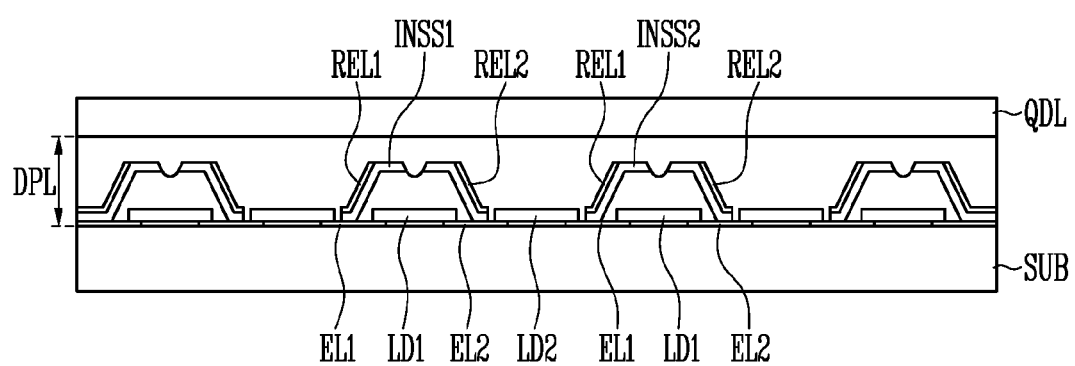
FIG. 14A is a schematic cross-sectional view illustrating the display element layer according to the embodiment.
Figure 14B:
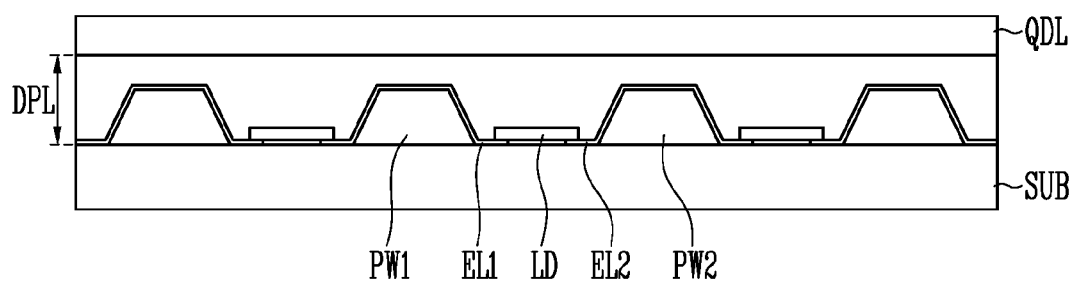
FIG. 14B is a schematic cross-sectional view illustrating a display element layer according to the comparative example.

FIG. 14A is a schematic cross-sectional view illustrating the display element layer according to the embodiment. FIG. 14B is a schematic cross-sectional view illustrating a display element layer according to the comparative example. FIG. 15 is a graph showing the amount of light when light emitted from light emitting elements of the display element layer of FIGS. 14A and 14B is incident on a quantum dot layer.

Specifically, FIG. 14A illustrates the display element layer DPL in which the first light emitting elements LD1 are disposed in the first and second spaces IS1 and IS2 of the first and second insulating structures INSS1 and INSS2, respectively, and the second light emitting element LD2 may be disposed between the first insulating structure INSS1 and the second insulating structure INSS2. FIG. 14B illustrates a display device layer DPL in which a light emitting element LD may be disposed only between the first partition wall PW1 and the second partition wall PW2 according to the comparative example. FIG. 15 schematically shows results of simulating the amount of light incident on the light conversion layer QDL having the same area in the embodiment and the comparative example.

Referring to FIGS. 14A, 14B and 15, in contrast to the comparative example in which the light emitting element LD is disposed only between the first and second partition walls PW1 and PW2, according to the embodiment, as the light emitting elements LD1 and LD2 are disposed in the first and second spaces IS1 and IS2 of the first and second insulating structures INSS1 and INSS2, and between the first and second insulating structures INSS1 and INSS2, respectively, the number of light emitting elements LD that may be disposed per unit area of the substrate SUB can be increased. Referring to FIG. 15, in contrast to the comparative example, according to the embodiment, the amount of the light incident on the light conversion layer QDL of the same area may be increased by about 16.4%.

The number of light emitting elements LD per unit area of the substrate SUB may be increased, and thus the amount of the light incident on the light conversion layer QDL can be effectively increased.

The display device having excellent alignment degree of light emitting elements and the method of manufacturing the same can be provided.

The foregoing detailed description illustrates and describes embodiments of the disclosure. As described above, the invention can be used in various other combinations, changes, and environments, and can be changed or modified within the scope of the inventive concept disclosed herein, the equivalents of the written disclosures, and/or the scope of the skill or knowledge of the art. Accordingly, the foregoing detailed description of the invention is not intended to limit the invention to the disclosed embodiments. Also, the appended claims should be construed as including other embodiments as well.

What is claimed is:

1. A method of manufacturing a display device, the method comprising:
   forming a first electrode and a second electrode on a substrate;
   forming at least one pattern on the substrate to have a convex shape with respect to the substrate and to expose a portion of the first electrode and a portion of the second electrode;
   sequentially forming an insulating layer and a conductive material layer on the substrate;
   patterning the conductive material layer to form a third electrode exposing a portion of the insulating layer;
   patterning the insulating layer to form a hole exposing the at least one pattern;
   removing the at least one pattern from the substrate to form at least one insulating structure having the convex shape with respect to the substrate;
   providing a first light emitting element for emitting light in the at least one insulating structure; and
   aligning the first light emitting element between the first electrode and the second electrode.

2. The method of claim 1, wherein the removing of the at least one pattern includes removing the at least one pattern through the hole to form a spacein the at least one insulating structure.

3. The method of claim 1, wherein the providing of the first light emitting element includes disposing the first light emitting element in the space of the at least one insulating structure through the hole.

4. The method of claim 1, wherein the aligning of the first light emitting element includes applying a voltage to the first electrode, the second electrode, and the third electrode.

5. The method of claim 1, wherein the sequentially forming of the conductive material layer includes electrically connecting the conductive material layer to the first electrode and the second electrode.

6. The method of claim 5, wherein the aligning of the first light emitting element includes applying a voltage to the first electrode and the second electrode.

7. The method of claim 1, wherein
   the at least one pattern includes a first pattern and a second pattern adjacent to each other, and
   the removing of the at least one pattern includes exposing the portion of the first electrode and the portion of the second electrode disposed between the first pattern and the second pattern.

8. The method of claim 7, wherein
   the at least one insulating structure includes a first insulating structure and a second insulating structure adjacent to each other, and
   the method further comprises providing a second light emitting element between the first insulating structure and the second insulating structure.

9. The method of claim 8, further comprising:
   aligning the second light emitting element between the first insulating structure and the second insulating structure,
   wherein the aligning of the second light emitting element and the aligning of the first light emitting element are simultaneously performed.

10. The method of claim 1, further comprising:
    providing a light conversion layer on the at least one insulating structure for converting the light emitted from the first light emitting element.

* * * * *